US012652872B2

(12) United States Patent
Jin

(10) Patent No.: US 12,652,872 B2
(45) Date of Patent: Jun. 9, 2026

(54) IMAGE SENSOR AND METHOD OF MANUFACTURING THE SAME

(71) Applicant: SAMSUNG ELECTRONICS CO., LTD., Suwon-si (KR)

(72) Inventor: Younggu Jin, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 344 days.

(21) Appl. No.: 18/476,637

(22) Filed: Sep. 28, 2023

(65) Prior Publication Data

US 2024/0162258 A1     May 16, 2024

(30) Foreign Application Priority Data

Nov. 16, 2022   (KR) ........................ 10-2022-0154018
Feb. 3, 2023    (KR) ........................ 10-2023-0014900

(51) Int. Cl.
H01L 27/146     (2006.01)
H10F 39/00      (2025.01)
H10F 39/18      (2025.01)

(52) U.S. Cl.
CPC ....... H10F 39/80373 (2025.01); H10F 39/18 (2025.01); *H10F 39/014* (2025.01); *H10F 39/807* (2025.01)

(58) Field of Classification Search
CPC ...... H10F 39/014; H10F 39/18; H10F 39/802; H10F 39/80373; H10F 39/8053; H10F 39/807; H10F 39/813
See application file for complete search history.

(56) References Cited

U.S. PATENT DOCUMENTS

| | | | | |
|---|---|---|---|---|
| 10,937,820 | B2 * | 3/2021 | Kudoh | H10D 30/62 |
| 11,444,108 | B2 * | 9/2022 | Mun | H10F 39/18 |
| 11,450,696 | B1 * | 9/2022 | Zang | H10F 39/80373 |
| 11,587,963 | B2 * | 2/2023 | Nakagawa | H10F 39/80373 |
| 12,302,658 | B2 * | 5/2025 | Chen | H10F 39/8067 |
| 2019/0123079 | A1 * | 4/2019 | Kudoh | H10D 64/513 |
| 2020/0091212 | A1 * | 3/2020 | Park | H10F 39/813 |
| 2020/0161349 | A1 * | 5/2020 | Kudoh | H10D 64/513 |
| 2022/0013554 | A1 * | 1/2022 | Mun | H10F 39/802 |
| 2023/0261021 | A1 * | 8/2023 | Wang | H10F 39/807 |
| | | | | 257/292 |

FOREIGN PATENT DOCUMENTS

| | | |
|---|---|---|
| CN | 104681438 | 6/2015 |
| CN | 111785749 | 10/2020 |
| CN | 112259569 | 1/2021 |
| CN | 114743998 | 7/2022 |

* cited by examiner

*Primary Examiner* — Jaehwan Oh
(74) *Attorney, Agent, or Firm* — Morgan, Lewis & Bockius LLP

(57) ABSTRACT

An image sensor includes a substrate, a vertical gate including a vertical extension vertically extending into the substrate from a top of the substrate, and a horizontal extension extending in parallel with a top surface of the substrate from a top of the vertical extension, a photodiode (PD) disposed under the vertical gate inside the substrate, a spacer disposed between the horizontal extension and the substrate, and a gate insulation layer. A bottom surface and side surfaces of the vertical extension and a bottom surface of the horizontal extension are covered by the gate insulation layer, and the spacer is disposed between the substrate and the gate insulation layer of the horizontal extension.

20 Claims, 27 Drawing Sheets

IMAGE SENSOR AND METHOD OF MANUFACTURING THE SAME

CROSS-REFERENCE TO RELATED APPLICATIONS

This application claims priority under 35 U.S.C. § 119 to Korean Patent Application No's. 10-2022-0154018, filed on Nov. 16, 2022, and 10-2023-0014900, filed on Feb. 3, 2023, in the Korean Intellectual Property Office, the disclosures of which are incorporated by reference herein in their entireties.

TECHNICAL FIELD

Embodiments of the inventive concept relate to an image sensor, and more particularly, to an image sensor including a vertical gate structure.

DISCUSSION OF RELATED ART

An image sensor converts an optical image into an electrical signal. As advances are made in the computer industry and the communication industry, the demand for image sensors with improved performance has been increasing in various fields such as, for example, digital cameras, camcorders, personal communication systems (PCS), game devices, security cameras, and medical micro cameras. An image sensor may be configured by arranging a plurality of unit pixels in a 2-dimensional array. Generally, a unit pixel may include one photodiode and a plurality of pixel transistors. Here, the pixel transistors may include, for example, a transfer transistor, a reset transistor, a source follower transistor, and a selection transistor. Recently, as the pixel size is miniaturized, an image sensor including a vertical gate structure is being developed.

SUMMARY

Embodiments of the inventive concept provide an image sensor including a vertical gate, which may prevent a potential hump from forming while increasing charge transfer efficiency, and a method of manufacturing the same.

According to an aspect of the inventive concept, there is provided an image sensor including a substrate, a vertical gate including a vertical extension vertically extending into the substrate from a top of the substrate, and a horizontal extension extending in parallel with a top surface of the substrate from a top of the vertical extension, a photodiode (PD) disposed under the vertical gate inside the substrate, a spacer disposed between the horizontal extension and the substrate, and a gate insulation layer. A bottom surface and side surfaces of the vertical extension and a bottom surface of the horizontal extension are covered by the gate insulation layer, and the spacer is disposed between the substrate and the gate insulation layer of the horizontal extension.

According to an aspect of the inventive concept, there is provided an image sensor including a substrate, a dual vertical gate including two vertical extensions vertically extending from a top of the substrate into the substrate and spaced apart from each other in a first direction parallel to a top surface of the substrate, and a connection portion connecting the two vertical extensions to each other on the substrate, a photodiode (PD) disposed under the dual vertical gate inside the substrate, a floating diffusion (FD) region disposed over the substrate and adjacent to the dual vertical gate in a second direction parallel to the top surface of the substrate and perpendicular to the first direction, a transistor (TR) region disposed opposite to the FD region around the dual vertical gate and having at least one transistor disposed therein, a gate insulation layer, and a spacer disposed between the connection portion and the substrate. A bottom surface and side surfaces of each of the two vertical extensions and a bottom surface of the connection portion are covered by the gate insulation layer, and the spacer is disposed between the substrate and a portion of the gate insulation layer covering the connection portion.

According to an aspect of the inventive concept, there is provided an image sensor including a substrate, a dual vertical gate including two vertical extensions vertically extending from a top of the substrate into the substrate and spaced apart from each other in a first direction parallel to a top surface of the substrate, and a connection portion connecting the two vertical extensions to each other on the substrate, a photodiode (PD) disposed under the dual vertical gate inside the substrate, one floating diffusion (FD) region disposed over the substrate and adjacent to the dual vertical gate in a second direction parallel to the top surface of the substrate and perpendicular to the first direction, a transistor (TR) region disposed opposite to the FD region around the dual vertical gate and having at least one transistor, a gate insulation layer, and a spacer disposed between the connection portion and the substrate. A bottom surface and side surfaces of each of the two vertical extensions and a bottom surface of the connection portion are covered by the gate insulation layer, the spacer is disposed between the substrate and a portion of the gate insulation layer covering the connection portion, and the image sensor has a shared pixel structure in which a plurality of PDs including the PD are arranged in correspondence to the one FD region and the plurality of PDs share the one FD region.

According to an aspect of the inventive concept, there is provided a method of manufacturing an image sensor, the method including forming a substrate insulation layer on a substrate, forming a photodiode (PD) inside the substrate, forming a spacer layer on the substrate insulation layer, forming a spacer pattern by patterning the spacer layer, forming a trench by etching an upper portion of the substrate by using the spacer pattern as an etching mask, forming a conductive layer filling the trench and covering the spacer pattern, and forming a dual vertical gate by patterning the conductive layer. The dual vertical gate includes two vertical extensions vertically extending from a top of the substrate into the substrate and spaced apart from each other in a first direction parallel to a top surface of the substrate, and a connection portion connecting the two vertical extensions to each other on the substrate.

BRIEF DESCRIPTION OF THE DRAWINGS

The above and other features of the inventive concept will become more apparent by describing in detail embodiments thereof with reference to the accompanying drawings, in which.

DETAILED DESCRIPTION OF THE EMBODIMENTS

Figure 1:
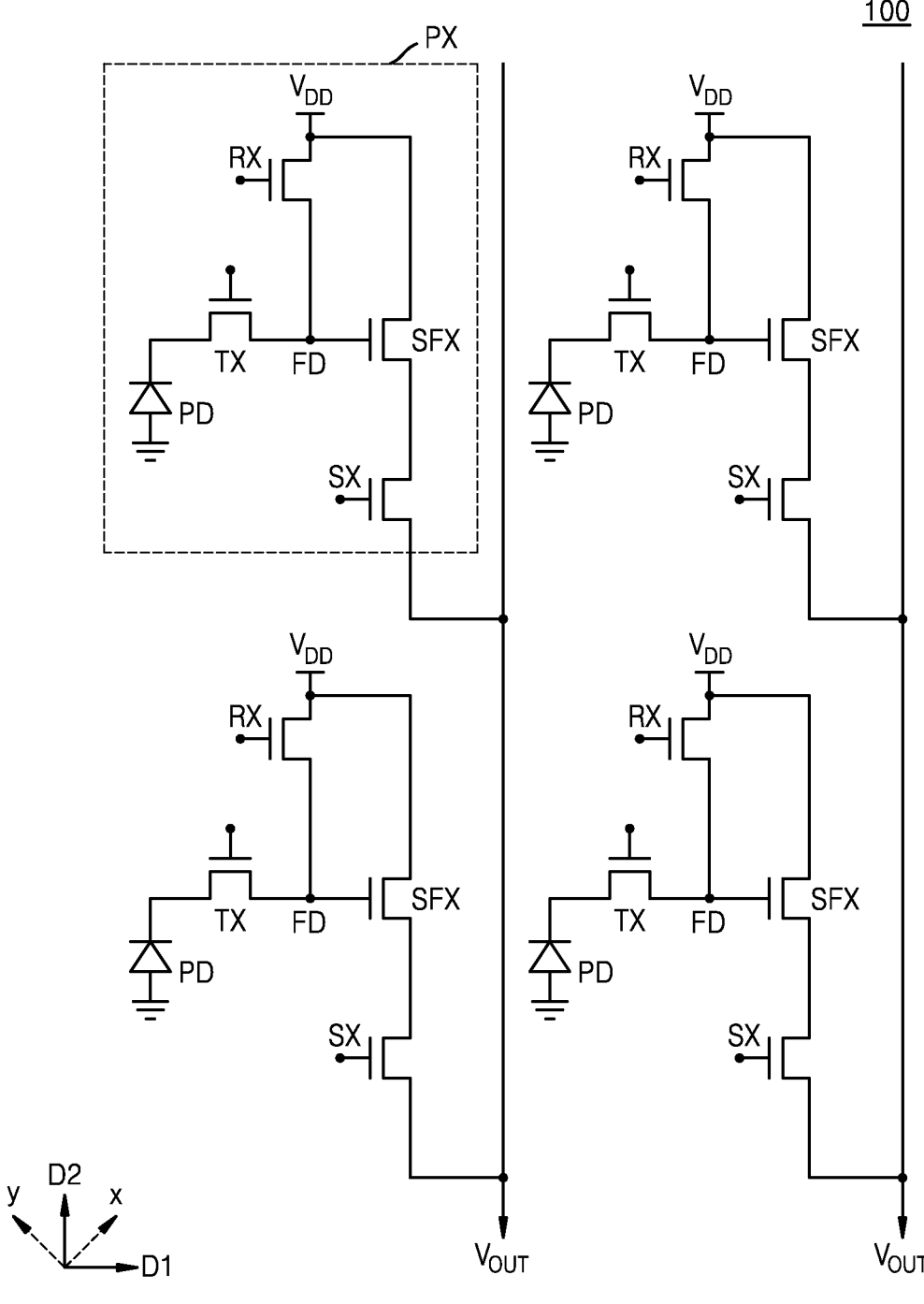
FIG. 1 is a circuit diagram of pixels of an image sensor including dual vertical gates, according to an embodiment.

Embodiments of the inventive concept will be described more fully hereinafter with reference to the accompanying drawings. Like reference numerals may refer to like elements throughout the accompanying drawings.

FIG. 1 is a circuit diagram of pixels of an image sensor including a dual vertical gate, according to an embodiment.

It will be understood that the terms "first," "second," "third," etc. are used herein to distinguish one element from another, and the elements are not limited by these terms. Thus, a "first" element in an embodiment may be described as a "second" element in another embodiment.

It should be understood that descriptions of features or aspects within each embodiment should typically be considered as available for other similar features or aspects in other embodiments, unless the context clearly indicates otherwise.

As used herein, the singular forms "a", "an" and "the" are intended to include the plural forms as well, unless the context clearly indicates otherwise.

Spatially relative terms, such as "beneath", "below", "lower", "under", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below.

It will be understood that when a component such as a film, a region, a layer, etc., is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. It will also be understood that when a component is referred to as "covering" another component, it can be the only component covering the other component, or one or more intervening components may also be covering the other component. Other words used to describe the relationships between components should be interpreted in a like fashion.

Herein, when two or more elements or values are described as being substantially the same as or about equal to each other, it is to be understood that the elements or values are identical to each other, the elements or values are equal to each other within a measurement error, or if measurably unequal, are close enough in value to be functionally equal to each other as would be understood by a person having ordinary skill in the art. For example, the term "about" as used herein is inclusive of the stated value and means within an acceptable range of deviation for the particular value as determined by one of ordinary skill in the art, considering the measurement in question and the error associated with measurement of the particular quantity (e.g., the limitations of the measurement system). For example, "about" may mean within one or more standard deviations as understood by one of the ordinary skill in the art. Further, it is to be understood that while parameters may be described herein as having "about" a certain value, according to exemplary embodiments, the parameter may be exactly the certain value or approximately the certain value within a measurement error as would be understood by a person having ordinary skill in the art. Other uses of these terms and similar terms to describe the relationships between components should be interpreted in a like fashion.

Referring to FIG. 1, an image sensor including a dual vertical gate according to an embodiment (hereinafter referred to as 'image sensor' 100) includes a plurality of pixels PXs, which may be arranged in a 2-dimensional array structure. For example, the pixels PXs may be arranged in a 2-dimensional array structure in two diagonal directions between the x direction and the y direction, that is, a first diagonal direction D1 and a second diagonal direction D2. The pixels PXs having the 2-dimensional array structure may constitute an active pixel sensor (APS).

The pixels PXs may each include a photodiode PD, a floating diffusion region FD, and pixel transistors. The pixel transistors may include, for example, a transfer transistor TX, a reset transistor RX, a source follower transistor SFX, and a selection transistor SX. The pixel transistors may be formed on a front surface FS (FIG. 2B) of a substrate 101 (FIG. 2B). The pixel transistors may be connected to a wiring layer disposed on the front surface FS of the substrate 101 through contacts.

The photodiode PD may generate and accumulate charges in proportion to the amount of external incident light. For example, an element that converts light into electric charge is generally referred to as a photoelectric conversion element, and the photodiode PD may correspond to a type of photoelectric conversion element. However, in the image sensor 100 according to an embodiment, photoelectric conversion elements arranged in the pixels PXs are not limited to photodiodes PD. For example, other types of photoelectric conversion elements such as a phototransistor, a photogate, a pinned photodiode, and a combination thereof may be disposed in the pixels PXs according to embodiments.

In the image sensor 100 according to an embodiment, the transfer transistor TX may include a dual vertical gate 110 (FIG. 2B). The transfer transistor TX may transfer charges generated by the photodiode PD to the floating diffusion region FD. The structure of the dual vertical gate 110 of the transfer transistor TX is described below in more detail with reference to FIGS. 2A and 2B.

The floating diffusion region FD may receive and cumulatively store charges generated by the photodiode PD. The source follower transistor SFX may be controlled according to the amount of charges accumulated in the floating diffusion region FD. The reset transistor RX may periodically reset charges accumulated in the floating diffusion region FD. A drain of the reset transistor RX may be connected to the floating diffusion region FD, and a source of the reset transistor RX may be connected to a power voltage $V_{DD}$. When the reset transistor RX is turned on, the power voltage $V_{DD}$ connected to the source of the reset transistor RX may be applied to the floating diffusion region FD. Therefore, when the reset transistor RX is turned on, charges accumulated in the floating diffusion region FD may be discharged, and thus, the floating diffusion region FD may be reset.

The source follower transistor SFX may correspond to a source follower buffer amplifier. In other words, the source follower transistor SFX may amplify a potential change according to the amount of charge in the floating diffusion region FD and output the power voltage $V_{DD}$ corresponding to the amplified potential change to an output line Vout through the selection transistor SX. The selection transistor SX may select the pixels PXs to be read row-by-row. When the selection transistor SX is turned on, the power voltage $V_{DD}$ applied to a drain electrode of the source follower transistor SFX may be output through the source follower transistor SFX and the selection transistor SX.

Figure 2A:
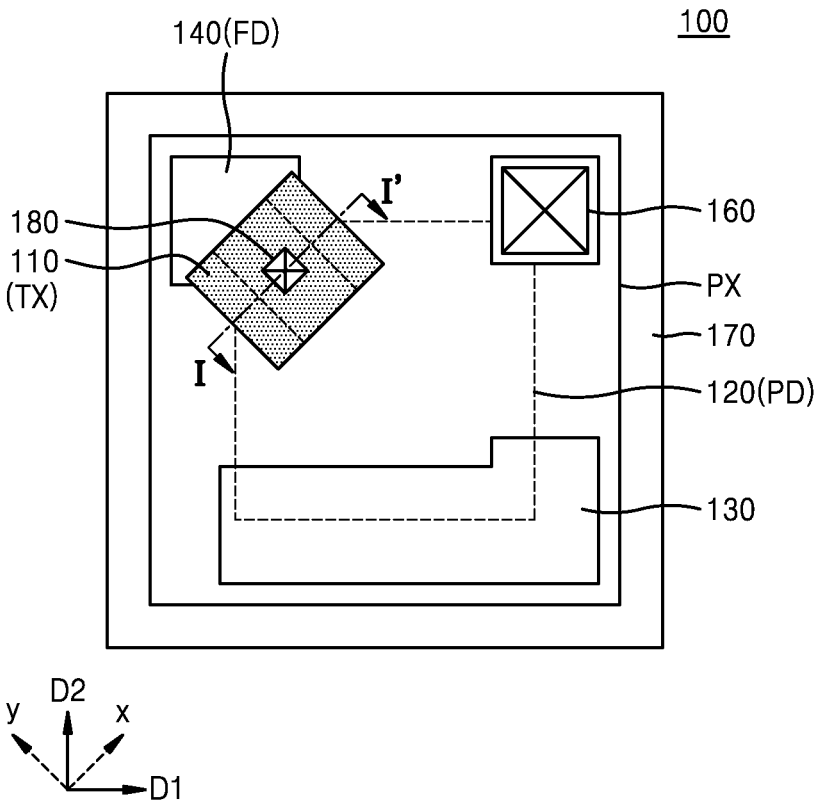
FIGS. 2A and 2B are a plan view and a cross-sectional view, respectively, of the image sensor including a dual vertical gate of FIG. 1, according to an embodiment.
Figure 2B:
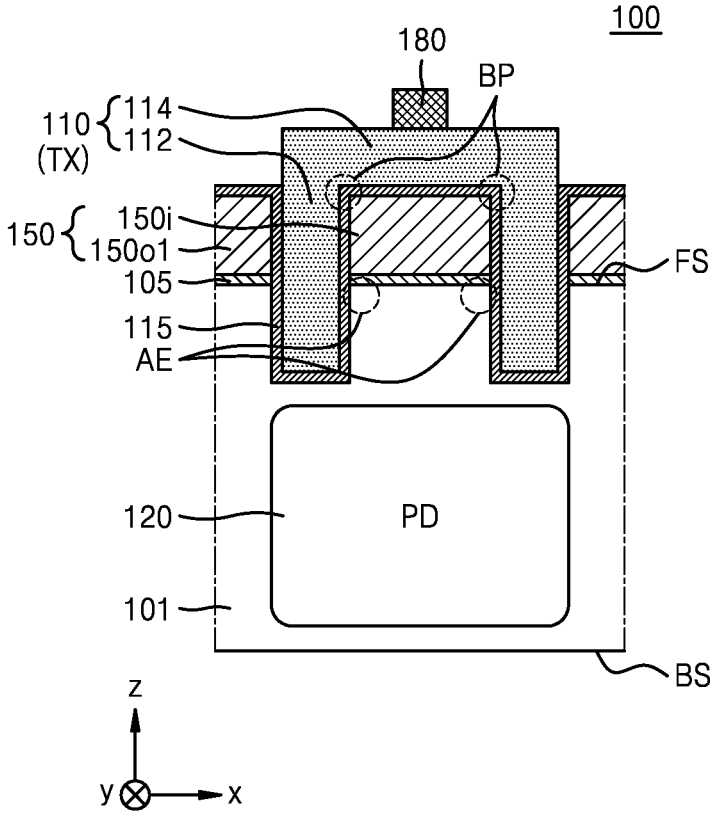

FIGS. 2A and 2B are a plan view and a cross-sectional view, respectively, of the image sensor 100 including a dual vertical gate of FIG. 1. FIG. 2B is a cross-sectional view taken along line I-F of FIG. 2A. Descriptions of FIGS. 2A and 2B are given below with reference to FIG. 1, and for convenience of explanation, a further description of components and technical aspects previously described with reference to FIG. 1 may be only briefly given or omitted.

Referring to FIGS. 2A and 2B, the image sensor 100 according to an embodiment may include the substrate 101, the dual vertical gate 110, a photodiode 120 or PD, a TR region 130, a floating diffusion region 140 or FD, and a spacer 150.

The substrate 101 may include the front surface FS and a back surface BS opposite to the front surface FS. A wiring layer may be disposed on the front surface FS of the substrate 101, and a light transmitting layer may be disposed on the back surface BS of the substrate 101. The light transmitting layer may include, for example, a color filter and a micro lens. Light may be incident on the photodiode 120 through the light transmitting layer on the back surface BS of the substrate 101. Generally, a structure or an image sensor in which a wiring layer and a light transmitting layer are arranged on surfaces of the substrate 101 opposite to each other, e.g., a structure in which a wiring layer is disposed on the front surface FS of the substrate 101 and a light transmitting layer is disposed on the back surface BS of the substrate 101, is referred to as a back side illumination (BSI) structure or a BSI image sensor. On the contrary, a structure in which a wiring layer and a light transmitting layer are arranged together on the same surface of the substrate 101, e.g., the front surface FS of the substrate 101, is referred to as a front side illumination (FSI) structure or an FSI image sensor.

The substrate 101 may be a substrate in which an epitaxial layer of a first conductivity type (e.g., p-type) is grown on a bulk silicon substrate of the first conductivity type. According to embodiments, the substrate 101 may include only an epitaxial layer, and all bulk silicon substrate portions may be removed. According to embodiments, the substrate 101 may be a bulk silicon substrate including wells of the first conductivity type. Alternatively, according to embodiments, the substrate 101 may include various types of substrates like a substrate including an epitaxial layer of a second conductivity type (e.g., n-type) and a silicon-on-insulator (SOI) substrate.

The substrate 101 may include the plurality of pixels PXs defined by a pixel isolation structure 170. In FIG. 2A, a portion surrounded by the pixel isolation structure 170 may correspond to one pixel PX. As described above, the pixels PXs may be arranged in a 2-dimensional array structure in the first diagonal direction D1 and the second diagonal direction D2, thereby constituting an APS.

The pixel isolation structure 170 may prevent charges generated when light is incident on a particular pixel PX from entering an adjacent pixel PX. In other words, the pixel isolation structure 170 may prevent or reduce crosstalk between adjacent pixels PXs. When viewed from above, the pixel isolation structure 170 has a lattice-like shape and may completely surround each of the pixels PXs. The pixel isolation structure 170 may extend from the front surface FS to the back surface BS of the substrate 101 and penetrate through the substrate 101.

The pixel isolation structure 170 may include a central conductive layer and an outer insulation layer. The central conductive layer is disposed in the central portion of the pixel isolation structure 170 and may include, for example, polysilicon doped with impurities. A ground voltage or a negative voltage may be applied to the central conductive layer. As a ground voltage or a negative voltage is applied to the central conductive layer, positive charges generated by the pixel PX may be induced to the voltage of the central conductive layer and removed through a ground contact. As a result, the dark current characteristic of the image sensor 100 may be enhanced through the central conductive layer of the pixel isolation structure 170. The outer insulation layer may be disposed in the outer portion of the pixel isolation structure 170 by surrounding the central conductive layer. The outer insulation layer may insulate the central conductive layer from the substrate 101. The outer insulation layer may include, for example, a silicon oxide layer, a silicon oxynitride layer, or a silicon nitride layer.

According to some embodiments, a buried layer may be disposed inside the central conductive layer. The buried layer may prevent the formation of voids in the pixel isolation structure 170 and prevent warpage of the substrate 101 by offsetting tensile stress applied to the substrate 101 during a high-temperature process. Therefore, the buried layer may include a material having a thermal expansion coefficient that is different from that of the central conductive layer. For example, the buried layer may include a metal oxide, a metal nitride, a metal, or a combination thereof. Alternatively, the buried layer may include a silicon compound like SiCN, SiON, or SiOC.

The pixel isolation structure 170 may be formed by forming a deep trench in the substrate 101 and filling the trench with an insulation material and a conductive material. Therefore, the pixel isolation structure 170 may also be referred to as a deep trench isolation (DTI) structure. The pixel isolation structure 170 may be classified as a front side DTI (FDTI) structure or a back side DTI (BDTI) structure, depending on whether a trench is formed in the front side or the back side of the substrate 101. Also, the pixel isolation structure 170 may have various shapes depending on the shape of the trench. For example, according to embodiments, the pixel isolation structure 170 may not completely penetrate through the substrate 101. Also, the pixel isolation structure 170 may have a structure penetrating through a device isolation layer 175 (refer to FIG. 3B) disposed on the front surface FS of the substrate 101 or a structure contacting the bottom surface of the device isolation layer 175 without penetrating through the device isolation layer 175.

As described above, the photodiode 120 may generate and accumulate charges in proportion to the intensity of light incident through the back surface BS of the substrate 101, that is, the amount of incident light. The photodiode 120 may include, for example, a first impurity region doped with an impurity of a first conductivity type (e.g., p-type) and a second impurity region doped with an impurity of a second conductivity type (e.g., n-type). The first impurity region and the second impurity region may constitute a p-n junction. According to some embodiments, the substrate 101 may serve as the first impurity region. In such a case, the substrate 101 and the second impurity region may constitute the photodiode 120 without a separate first impurity region. The photodiode 120 may be disposed inside the substrate 101 at the center portion of each of the pixels PXs. For example, as shown in FIG. 2B, the photodiode 120 may be disposed in a portion of the substrate 101 below the dual vertical gate 110 of the transfer transistor TX.

The device isolation layer 175 defining active regions may be provided on the front surface FS of the substrate 101. Here, the active regions may include a region where the dual vertical gate 110 and an FD region 140 are arranged, a region where the TR region 130 and a ground contact 160 are arranged, etc. In FIG. 2A, portions surrounded by solid lines inside the pixel PX may correspond to active regions.

The bottom surface of the device isolation layer 175 may be spaced apart from the photodiode PD. The depth of the device isolation layer 175 may be less than the depth of the pixel isolation structure 170. The device isolation layer 175 may be, for example, a shallow trench isolation (STI) layer. The pixel isolation structure 170 may overlap a portion of the device isolation layer 175. For example, the pixel isolation structure 170 may penetrate through the device isolation layer 175 and extend.

When viewed from above, within the pixel PX, the FD region 140 may be disposed on the left side in the y direction, and the TR region 130 may be disposed on the right side in the y direction. For example, the FD region 140 may be disposed on the left side in the y direction to be adjacent to the dual vertical gate 110. In addition, the ground contact 160 may be disposed on the right side in the x direction. According to embodiments, the TR region 130 has an L-like shape, but the shape of the TR region 130 is not limited thereto. For example, the TR region 130 may have a line shape extending in the first diagonal direction D1.

A substrate insulation layer 105 may be disposed on the front surface FS of the substrate 101. The substrate insulation layer 105 may include an oxide layer such as, for example, thermal oxide, silicon oxide (SiO), or aluminum oxide (AlO). The substrate insulation layer 105 may have a thickness of, for example, about 10 nm or less. However, the material and the thickness of the substrate insulation layer 105 are not limited to those stated above. The substrate insulation layer 105 may be formed through, for example, an atomic layer deposition (ALD) process or a thermal oxidation process.

The spacer 150 may be disposed on the substrate insulation layer 105. The spacer 150 may include, for example, a nitride layer, an oxide layer, or an oxynitride layer. For example, the spacer 150 may include a silicon nitride layer. The spacer 150 may have a thickness of about 10 nm or more in the z direction. For example, the spacer 150 may have a thickness from about 50 nm to about 300 nm. However, the thickness of the spacer 150 is not limited to the above-stated values.

The spacer 150 may include an inner spacer 150i disposed inside the dual vertical gate 110 and an outer spacer 150o1 disposed outside the dual vertical gate 110. For example, the inner spacer 150i may be disposed below a connection portion 114 of the dual vertical gate 110. In addition, the outer spacer 150o1 may be disposed on a portion of the substrate 101 outside the dual vertical gate 110 in the x direction. According to embodiments, the outer spacer 150o1 may also be disposed on a portion of the substrate 101 outside the dual vertical gate 110 in the y direction.

In the image sensor 100 according to an embodiment, the spacer 150 may be disposed to remove a potential hump of the dual vertical gate 110 of the transfer transistor TX. As the thickness of the spacer 150 increases, the length of vertical extensions 112 of the dual vertical gate 110 may increase. Therefore, the thickness of the spacer 150 may be determined considering the length of the vertical extensions 112 of the dual vertical gate 110 and the effect of removing the potential hump. The spacer 150 and the effect of removing the potential hump are described below in more detail with reference to the description of the transfer transistor TX.

The transfer transistor TX may include the dual vertical gate 110. Here, when considering the functional aspect of the transistor, the dual vertical gate 110, the photodiode 120 or a portion of the substrate 101 including the photodiode 120, and the FD region 140 or a portion of the substrate 101 including the FD region 140 may constitute the transfer transistor TX. In other words, the photodiode 120 and the FD region 140 may constitute a source and a drain of the transfer transistor TX, respectively.

The dual vertical gate 110 may include polysilicon. However, the material of the dual vertical gate 110 is not limited to polysilicon. For example, the dual vertical gate 110 may have a multi-layered structure including a barrier film and at least one metal layer. The dual vertical gate 110 may include two vertical extensions 112 and the connection portion 114. The two vertical extensions 112 may each penetrate through the spacer 150, extend vertically into the substrate 101, and be spaced apart from each other in the x direction. Here, the vertical direction may refer to the z direction perpendicular to the top surface of the substrate 101. The connection portion 114 may connect the two vertical extensions 112 on the top surface of the spacer 150 to each other. Herein, the vertical extensions 112 are distinguished from the connection portion 114 for explanation, and the vertical extensions 112 and the connection portion 114 may include the same material and be integrated with each other. For example, the vertical extensions 112 and the connection portion 114 may be integrally formed of polysilicon.

As shown in FIG. 2A, the horizontal cross-section of the dual vertical gate 110 may have a rectangular shape. The rectangular shape may correspond to the shape of the horizontal cross-section of the dual vertical gate 110 at a level higher than a bottom surface of the connection portion 114 in the z direction. In the case of a level lower than the bottom surface of the connection portion 114 in the z direction, the horizontal cross-section of the dual vertical gate 110 may have a shape in which two small rectangles of the vertical extensions 112 are spaced apart from each other in the x direction.

The bottom surface and side surfaces of the vertical extensions 112 and the bottom surface of the connection portion 114 may be surrounded by a gate insulation layer 115. For example, the gate insulation layer 115 may be disposed between the vertical extensions 112 and the substrate 101, between the vertical extensions 112 and the spacer 150, between the connection portion 114 and the spacer 150, and on the top surface of the spacer 150 outside the dual vertical gate 110 in the x direction.

In the image sensor 100 according to an embodiment, the spacer 150 is disposed on the substrate 101, and the dual vertical gate 110 is disposed on the spacer 150, and thus, a potential hump caused by concentration of a field at edges AE of an active region due to a bent portion BP of a gate may be prevented. For example, considering a dual vertical gate structure without a spacer, a connection portion of dual vertical gates may be disposed directly above the active region of a substrate with a gate insulation layer disposed therebetween. Also, the vertical extensions of the dual vertical gates may directly extend into the active region of the substrate in the z direction. Therefore, a field concentrates on an edge of the active region corresponding to a bent portion of the gate, that is, a portion where the connection portion and the vertical extensions meet, and thus, a potential hump may occur.

On the contrary, the image sensor 100 according to an embodiment may have a structure in which the spacer 150 having a certain thickness is disposed on the substrate 101, the vertical extensions 112 of the dual vertical gate 110 penetrate through the spacer 150 and extend into the active region of the substrate 101, and the connection portion 114 is disposed on the spacer 150. Therefore, the edge AE of the active region of the substrate 101 is farther away from the bent portion BP of the gate, thereby alleviating field concentration. As a result, a potential hump occurring at the edge AE of the active region may be prevented.

To prevent a potential hump, a dual vertical gate structure without a connection portion, that is, a structure in which only vertical extensions exist, may be considered. However, in the case of a dual vertical gate structure without a connection portion, a gate contact is disposed at each vertical gate, and thus, the contact area increases. Also, since the top surface of each of vertical gates is small, a misalignment with a gate contact may occur. On the contrary, in the case of the image sensor 100 according to an embodiment, since the dual vertical gate 110 includes the connection portion 114, only one gate contact 180 may be disposed to reduce the contact area. Furthermore, since the top surface of the connection portion 114 is relatively large, misalignment with a gate contact 180 may be prevented or reduced.

Pixel transistors may be arranged in the TR region 130. For example, at least one of the reset transistor RX, the source follower transistor SFX, and the selection transistor SX may be disposed in the TR region 130. For example, all of the reset transistor RX, the source follower transistor SFX, and the selection transistor SX may be arranged in the TR region 130. Also, according to embodiments, the source follower transistor SFX and the selection transistor SX may be arranged in the TR region 130 of one pixel PX, and the reset transistor RX may be disposed in the TR region 130 of an adjacent pixel PX. In the case of such a structure, two adjacent pixels PXs may share pixel transistors. According to embodiments, a power voltage contact may be disposed in the TR region 130.

In the image sensor 100 according to an embodiment, the transfer transistor TX may include the dual vertical gate 110, and the dual vertical gate 110 may be disposed on the spacer 150 disposed on the substrate 101. For example, the dual vertical gate 110 may include two vertical extensions 112 penetrating through the spacer 150 and vertically extending into the substrate 101 and the connection portion 114 connecting the two vertical extensions 112 to each other on the spacer 150. Based on the structure of the dual vertical gate 110, the image sensor 100 according to an embodiment may effectively prevent a potential hump from occurring at the edge AE of an active region while increasing charge transfer efficiency. Also, the contact area of the gate contact 180 may be minimized or reduced, and misalignment with the gate contact 180 may be minimized or reduced.

Figure 3A:
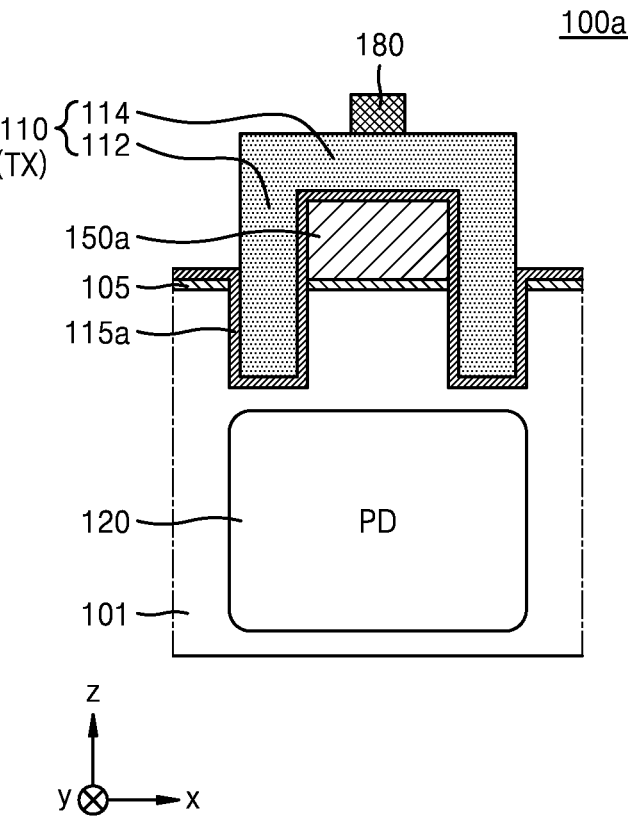
FIGS. 3A, 3B, 4A and 4B are cross-sectional views of an image sensor including a dual vertical gate, according to embodiments.
Figure 3B:
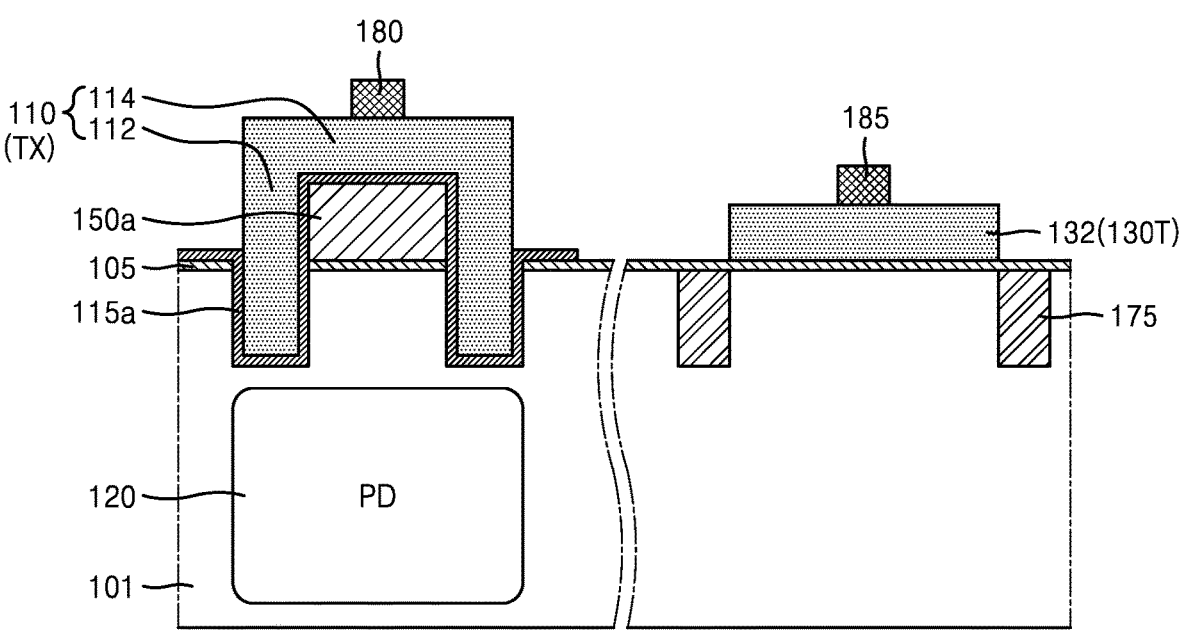
Figure 4A:
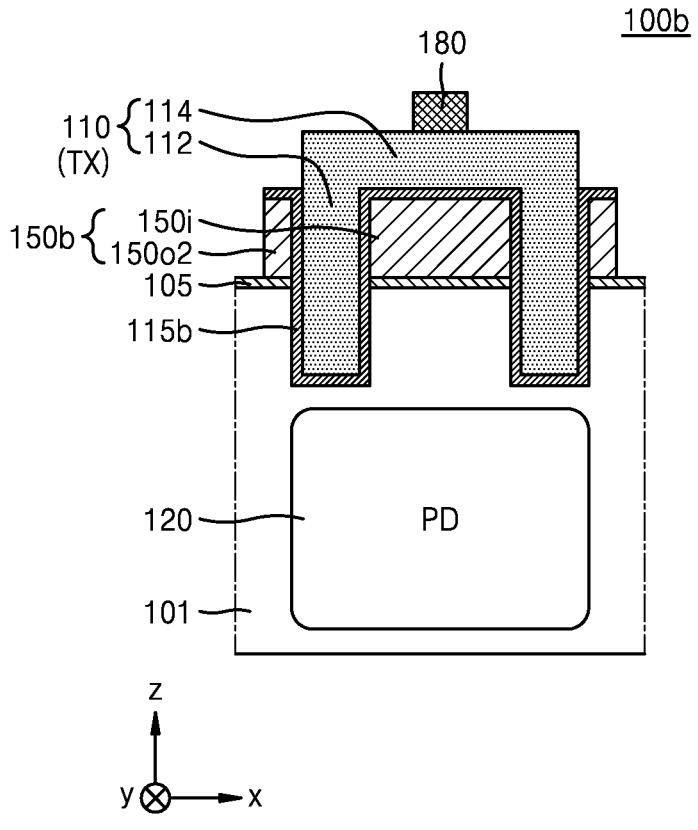
Figure 4B:
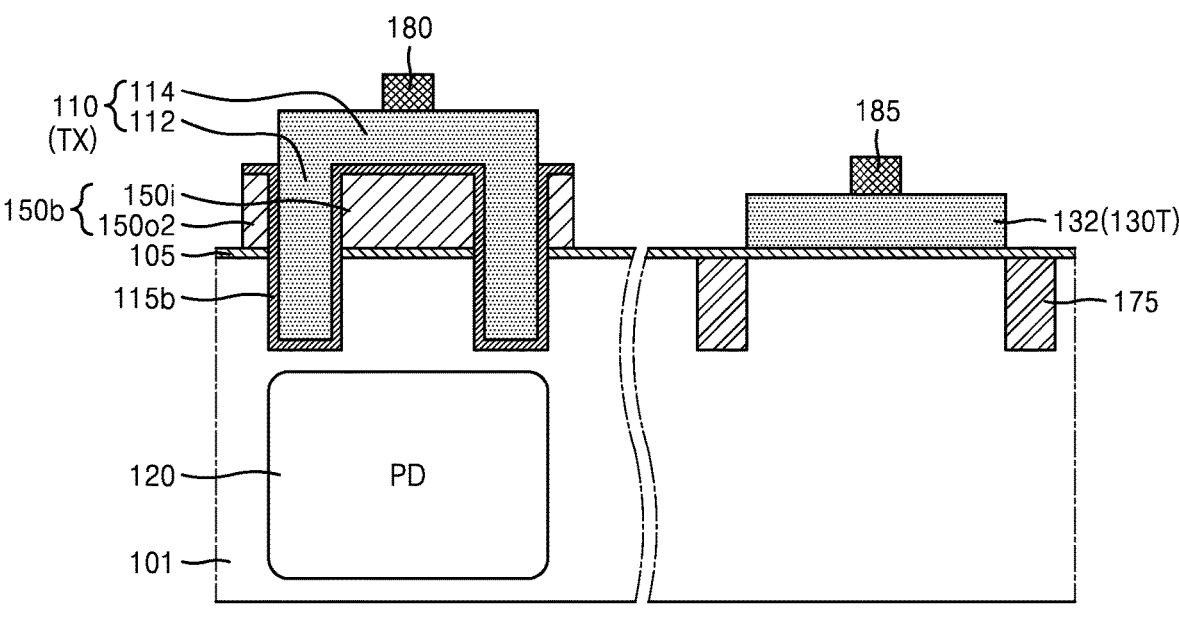

FIGS. 3A to 4B are cross-sectional views of an image sensor including dual vertical gates, according to embodiments. FIG. 3B is a cross-sectional view showing a dual vertical gate of FIG. 3A together with another transistor within a pixel, and FIG. 4B is a cross-sectional view showing a dual vertical gate of FIG. 4A together with another transistor within a pixel. Descriptions are given below with reference to FIG. 1, and for convenience of explanation, a further description of components and technical aspects previously described with reference to FIGS. 1 to 2B may be only briefly given or omitted.

Referring to FIGS. 3A and 3B, an image sensor 100a according to an embodiment may be different from the image sensor 100 of FIG. 2B in light of the structure of a spacer 150a. For example, in the image sensor 100a according to an embodiment, the spacer 150a may be disposed only inside the dual vertical gate 110 and is not be disposed outside the dual vertical gate 110. In other words, in an embodiment, the spacer 150a may be disposed only under the connection portion 114 of the dual vertical gate 110 and is not disposed outside the dual vertical gate 110 in the x direction. Also, as may be anticipated from FIG. 2A, in an embodiment, the spacer 150a is not disposed outside the dual vertical gate 110 in the y direction. Since the spacer 150a is disposed only inside the dual vertical gate 110, a gate insulation layer 115a may be disposed directly on the substrate insulation layer 105 outside the dual vertical gate 110. The structure of the spacer 150a may be formed by removing a spacer pattern outside the dual vertical gate 110 before the dual vertical gate 110 is formed. A method of manufacturing the image sensor 100a according to an embodiment is described in more detail with reference to the description of FIGS. 9A to 9C.

Due to the structure of the spacer 150a of the image sensor 100a according to an embodiment, a gate 132 of another transistor 130T in the pixel may be formed together with the dual vertical gate 110. Therefore, the structure of the spacer 150a of the image sensor 100a according to an embodiment may contribute to process simplification. Here, the other transistor 130T within the pixel is a pixel transistor and may be any one of the source follower transistor SFX, the reset transistor RX, and the selection transistor SX. The other transistor 130T may include the gate 132 having a planar structure. The gate 132 having the planar structure may be directly disposed on the substrate 101 with the substrate insulation layer 105 disposed therebetween. In other words, in an embodiment, the spacer 150a is not disposed between the gate 132 and the substrate 101. A gate contact 185 may be disposed on the top surface of the gate 132.

The device isolation layer 175 may be disposed on portions of the substrate 101 on both sides of the gate 132 of the other transistor 130T. The device isolation layer 175 may include an STI layer or a p-type barrier layer. According to embodiments, source/drain regions may be arranged on both sides of the gate 132 in a direction entering the plane in the figure.

Also, in the case of the image sensor 100 of FIG. 2B, a separate process of removing the spacer 150 outside the dual vertical gate 110 may be performed to form the other transistor 130T, that is, a pixel transistor. After the spacer 150 outside the dual vertical gate 110 is removed in this way, a gate having a planar structure of the pixel transistor may be formed. Therefore, in an embodiment, the spacer 150 is not disposed between the gate 132 of the pixel transistor and the substrate 101.

Referring to FIGS. 4A and 4B, an image sensor 100*b* according to an embodiment may be different from the image sensor 100 of FIG. 2B in light of the structure of a spacer 150*b*. For example, in the image sensor 100*b* according to an embodiment, the spacer 150*b* may include the inner spacer 150*i* disposed inside the dual vertical gate 110 and an outer spacer 150*o*2 disposed outside the dual vertical gate 110. For example, the inner spacer 150*i* may be disposed below a connection portion 114 of the dual vertical gate 110. In addition, the outer spacer 150*o*2 may be disposed on a portion of the substrate 101 outside the dual vertical gate 110 in the x direction and the y direction. However, in the image sensor 100*b* according to an embodiment, the outer spacer 150*o*2 may be disposed only at a location very close to the dual vertical gate 110 and is not disposed at a location a certain distance away from the dual vertical gate 110. For example, the outer spacer 150*o*2 may be disposed only at a distance of about 300 nm or less from the dual vertical gate 110. The structure of the spacer 150*b* may be formed by forming a gate insulation layer on a spacer pattern and, before the dual vertical gate 110 is formed, patterning the spacer pattern and the gate insulation layer to the shape shown in FIG. 4A. The bottom surface and side surfaces of the vertical extensions 112 and the bottom surface of the connection portion 114 may be surrounded by a gate insulation layer 115*b*. A method of manufacturing the image sensor 100*b* according to an embodiment is described in more detail with reference to the description of FIGS. 10A and 10B.

Due to the structure of the spacer 150*b* of the image sensor 100*b* according to an embodiment, the gate 132 of another transistor 130T in the pixel may be formed together with the dual vertical gate 110. Therefore, the structure of the spacer 150*b* of the image sensor 100*b* according to an embodiment may contribute to process simplification. The other transistor 130T within the pixel is a pixel transistor and may be any one of the source follower transistor SFX, the reset transistor RX, and the selection transistor SX and may include the gate 132 having a planar structure. The gate 132 having the planar structure may be directly disposed on the substrate 101 with the substrate insulation layer 105 disposed therebetween. In other words, in an embodiment, the spacer 150*b* is not disposed between the gate 132 and the substrate 101. The gate contact 185 may be disposed on the top surface of the gate 132.

Figure 5:
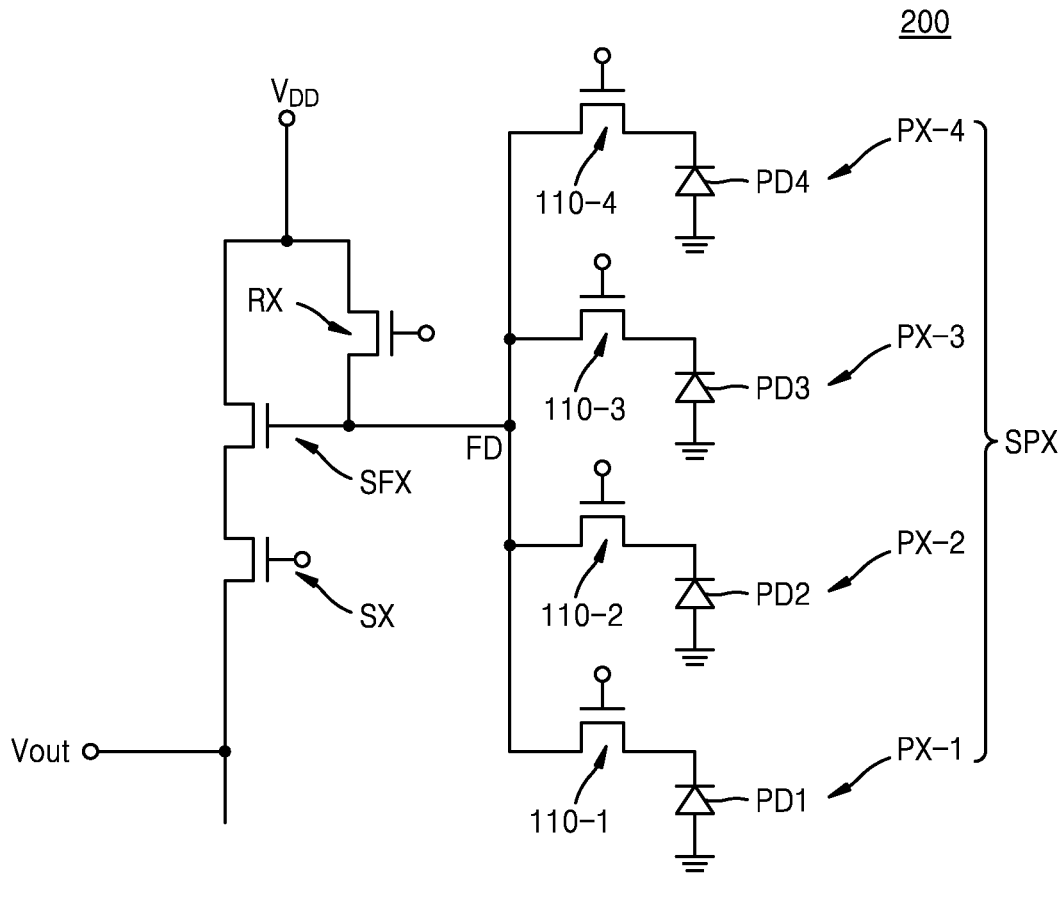
FIG. 5 is a circuit diagram of a pixel of an image sensor including a dual vertical gate, according to an embodiment.

FIG. 5 is a circuit diagram of a pixel of an image sensor including a dual vertical gate, according to an embodiment. For convenience of explanation, a further description of components and technical aspects previously given with reference to FIGS. 1 to 4B may be only briefly given or omitted.

Referring to FIG. 5, an image sensor 200 according to an embodiment may be different from the image sensor 100 of FIG. 1 in light of including a shared pixel SPX. In the image sensor 200 according to an embodiment, the shared pixel SPX may include four pixels PX-1 to PX-4, and may also include four photodiodes PD1 to PD4 and four dual vertical gates 110-1 to 110-4 in correspondence to the four pixels PX-1 to PX-4.

Figure 6A:
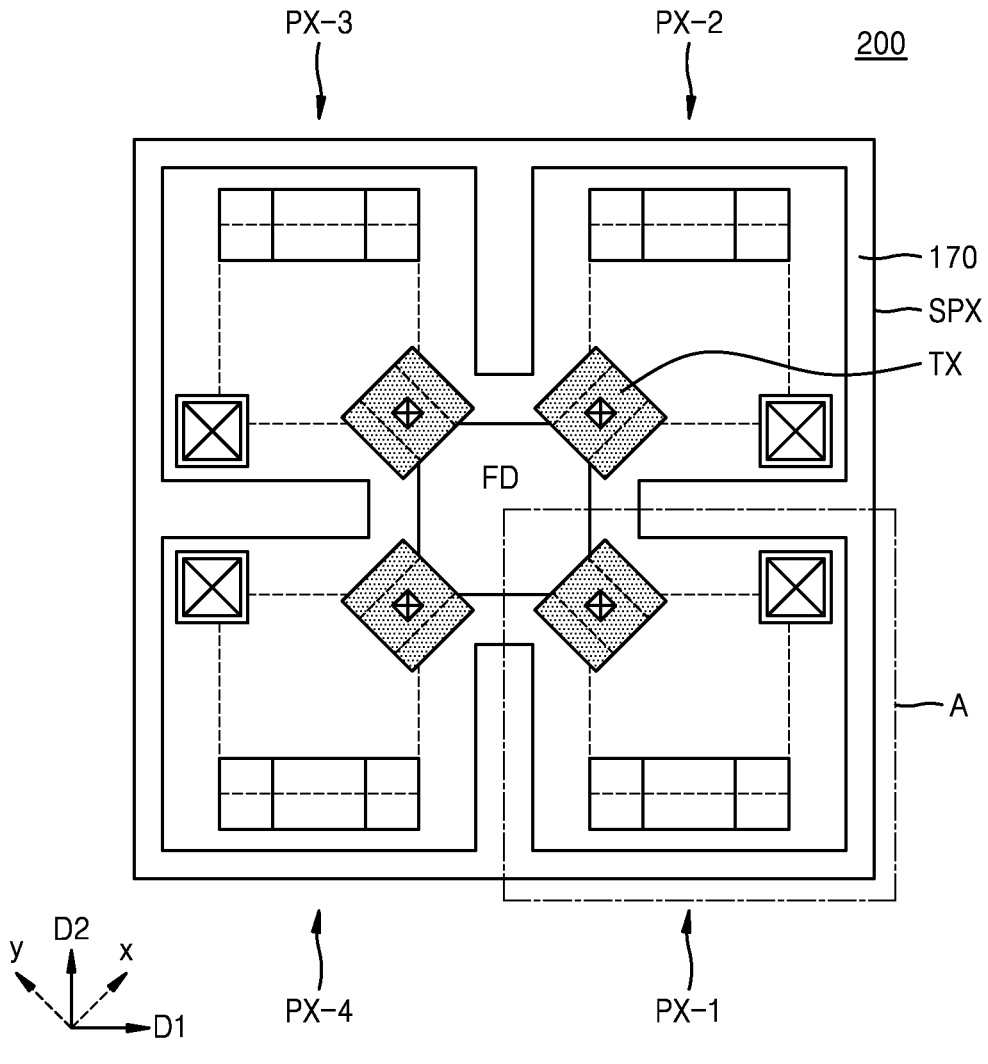
FIGS. 6A to 6C are a plan view, an enlarged plan view, and a cross-sectional view, respectively, of an image sensor including a dual vertical gate of FIG. 5 according to an embodiment.
Figure 6B:
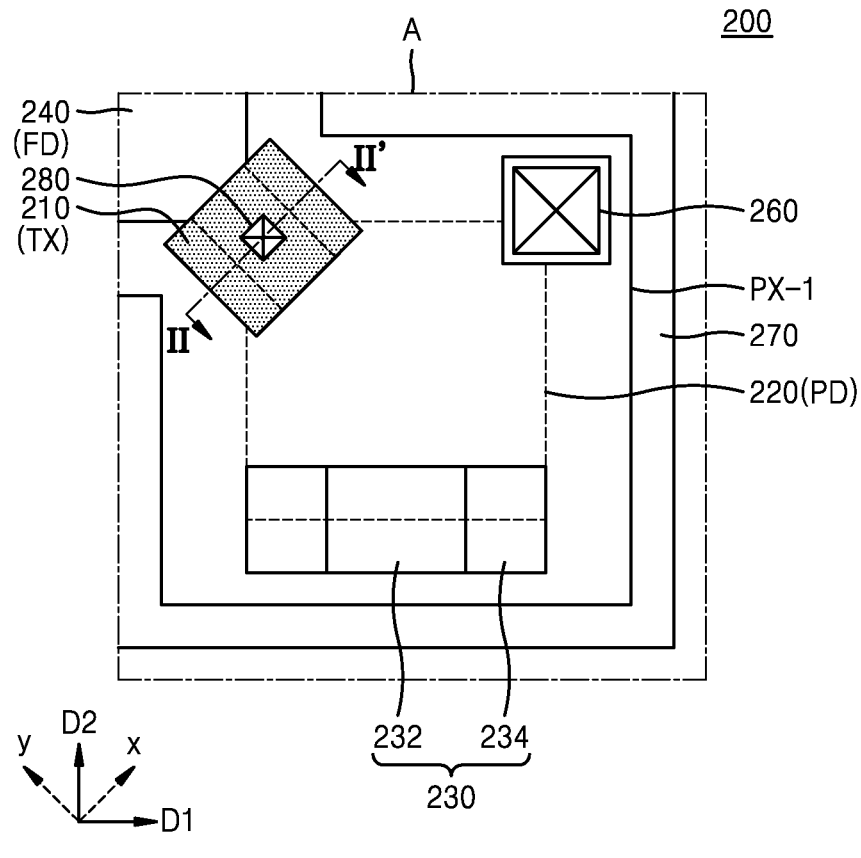

The four pixels PX-1 to PX-4 may share the floating diffusion region FD and may also share pixel transistors RX, SFX, and SX of a TR region 230 (refer to FIG. 6B). The connection structure from the reset transistor RX, the source follower transistor SFX, and the selection transistor SX in the TR region 230 to the floating diffusion region FD may be substantially the same as the connection structure from the reset transistor RX, the source follower transistor SFX, and the selection transistor SX to the floating diffusion region FD in the circuit diagram of FIG. 1.

In the image sensor 200 according to an embodiment, information regarding charges generated by the photodiode PD of each of the four pixels PX-1 to PX-4 may be output by commonly using the floating diffusion region FD and the pixel transistors RX, SFX, and SX. Also, the four pixels PX-1 to PX-4 may be distinguished from one another by controlling switching the transfer transistor TX on/off.

Figure 6C:
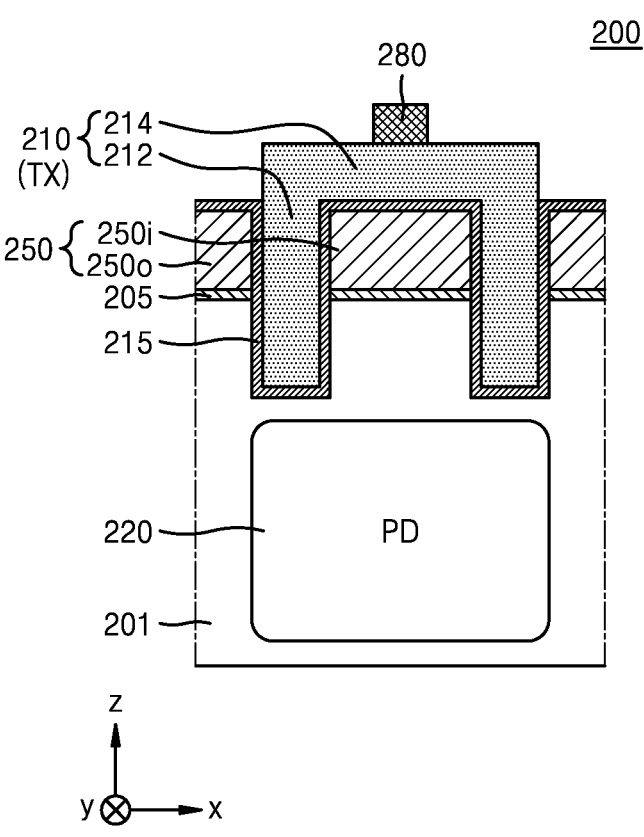

FIGS. 6A to 6C are respectively a plan view, an enlarged plan view, and a cross-sectional view of an image sensor including dual vertical gates of FIG. 5 according to an embodiment. FIG. 6B is an enlarged plan view of a portion A of FIG. 6A, and FIG. 6C is a cross-sectional view taken along line II-IT of FIG. 6B. For convenience of explanation, a further description of components and technical aspects previously given with reference to FIGS. 1 to 5 may be only briefly given or omitted.

Referring to FIGS. 6A to 6C, the image sensor 200 according to an embodiment may include a plurality of shared pixels SPXs, which may be arranged in a 2-dimensional array structure. For example, the shared pixels SPXs may be arranged in a 2-dimensional array structure in two diagonal directions between the x direction and the y direction, that is, the first diagonal direction D1 and the second diagonal direction D2. The plurality of shared pixels SPXs in the 2-dimensional array structure may constitute an APS.

In one shared pixel SPX, the four pixels PX-1 to PX-4 may be separated from one another through the pixel isolation structure 170. However, since the pixels PX-1 to PX-4 share an FD region 240, the pixels PX-1 to PX-4 may be separated from one another by the pixel isolation structure 170 except for the FD region 240. Therefore, except that the pixels PX-1 to PX-4 share the FD region 240 and each of the pixels PX-1 to PX-4 includes only one pixel transistor in the TR region 230, each pixel of the shared pixel SPX may have a structure almost identical to that of the pixel PX of FIG. 2A.

For example, in the image sensor 200 according to an embodiment, since the pixels PX-1 to PX-4 share the FD region 240 disposed at the center, the four transfer transistors TX corresponding to the four pixels PX-1 to PX-4 may be arranged adjacent to the FD region 240. The TR region 230 has a line shape extending in the first diagonal direction D1 and may include one pixel transistor. For example, a gate 232 and a source/drain region 234 constituting one of the pixel transistors RX, SFX, and SX may be arranged in the TR region 230. As shown in FIG. 5, the shared pixel SPX may include the four pixels PX-1 to PX-4, the reset transistor RX, the source follower transistor SFX, and the selection transistor SX. Accordingly, the TR region 230 of any one pixel may correspond to a redundant TR region 230 and also be referred to as so. In the image sensor 200 according to an embodiment, a dummy transistor or the source follower transistor SFX may be additionally disposed in the redundant TR region 230.

As shown in FIG. 6B, a ground contact 260 may be disposed on the right side in the x direction, the pixels PX may be defined by a pixel isolation structure 270, and the image sensor 200 may include a photodiode 220 or PD.

As shown in FIG. 6C, in the image sensor 200 according to an embodiment, the transfer transistor TX may include a dual vertical gate 210, and the dual vertical gate 210 may be disposed on a spacer 250 disposed on a substrate 201. For example, the dual vertical gate 210 may include two vertical extensions 212 penetrating through the spacer 250 and vertically extending into the substrate 201 and a connection portion 214 connecting the two vertical extensions 212 to each other on the spacer 250. The spacer may include an inner spacer 250i disposed inside the dual vertical gate 210 and an outer spacer 250o disposed outside the dual vertical gate 210. Based on the structure of the dual vertical gate 210, the image sensor 200 according to an embodiment may effectively prevent a potential hump from occurring at the edge AE of an active region while increasing charge transfer efficiency. Also, the contact area of a gate contact 280 may be minimized or reduced, and misalignment with the gate contact 280 may be minimized or reduced. The image sensor 200 may also include a substrate insulation layer 205, a gate insulation layer 215 and a photodiode 220.

Although the structure of the shared pixel SPX including the four pixels PX-1 to PX-4 has been described above, the number of pixels of the shared pixel SPX is not limited to four. For example, in an image sensor according to an embodiment, the shared pixel may include 2 pixels, 6 pixels, or 8 pixels.

Figure 7:
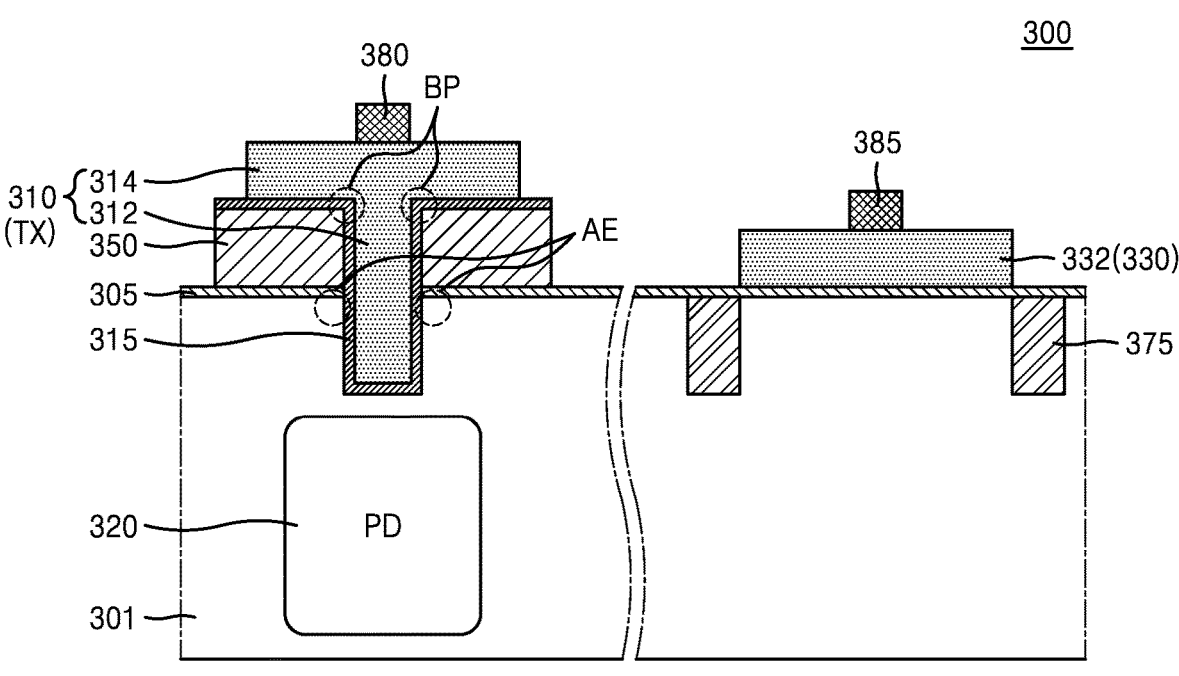
FIG. 7 is a cross-sectional view of an image sensor including a single vertical gate according to an embodiment.

FIG. 7 is a cross-sectional view of an image sensor including a single vertical gate according to an embodiment. For convenience of explanation, a further description of components and technical aspects previously described with reference to FIGS. 1 to 6C may be only briefly given or omitted.

Referring to FIG. 7, an image sensor 300 according to an embodiment may be different from the image sensor 100 of FIG. 2B in light of the transfer transistor TX having a single vertical gate structure. For example, the image sensor 300 according to an embodiment may include a substrate 301, a single vertical gate 310, a photodiode 320, a TR region, an FD region, a spacer 350, and a gate insulation layer 315. Descriptions of the substrate 301, the photodiode 320, the TR region, the FD region, and the spacer 350 may be identical to those given above with respect to the substrate 101, the photodiode 120, the TR region 130, the FD region 140, and the spacer 150.

The single vertical gate 310 may include a vertical extension 312 and a horizontal extension 314. The vertical extension 312 may penetrate through the spacer 150 and vertically extend into the substrate 301. The horizontal extension 314 may horizontally extend from the vertical extension 312 on the top surface of the spacer 150. Although in the structure of the single vertical gate 310, the vertical extension 312 is distinguished from the horizontal extension 314 for explanation, the vertical extension 312 and the horizontal extension 314 may include the same material and be integrated with each other. A bottom surface and side surfaces of the vertical extension 312 and a bottom surface of the horizontal extension 314 are covered by the gate insulation layer 315. The vertical extension 312 may vertically extend into the substrate 301 from a top of the substrate 301, and the horizontal extension 314 may extend in parallel with a top surface of the substrate 301 from a top of the vertical extension 312. The photodiode 320 is disposed under the vertical gate 310 inside the substrate 301. The spacer 350 is disposed between the horizontal extension 314 and the substrate 301, and is disposed between the substrate 301 and the gate insulation layer 315 of the horizontal extension 314.

The image sensor 300 according to an embodiment may have a structure in which the spacer 350 having a certain thickness is disposed on the substrate 301, the vertical extension 312 of the single vertical gate 310 penetrates through the spacer 350 and extends into the active region of the substrate 301, and the horizontal extension 314 is disposed on the spacer 350. Therefore, the edge AE of the active region of the substrate 301 is farther away from the bent portion BP of the gate, thereby alleviating field concentration. As a result, a potential hump occurring at the edge AE of the active region may be prevented. Also, even when the vertical extension 312 becomes smaller, a sufficient area of the gate contact 380 may be secured, and, since the top surface of the horizontal extension 314 is large, misalignment with the gate contact 380 may be prevented or reduced. The gate contact 380 may be disposed at a center of the horizontal extension 314 in the first direction.

In the image sensor 300 according to an embodiment, a gate 332 of another transistor 330 in a pixel may be formed together with the single vertical gate 310. The other transistor 330 within the pixel is a pixel transistor and may be any one of the source follower transistor SFX, the reset transistor RX, and the selection transistor SX and may include the gate 332 having a planar structure. The gate 332 having the planar structure may be directly disposed on the substrate 301 with a substrate insulation layer 305 disposed therebetween. That is, the substrate insulation layer 305 may be disposed between the substrate 301 and the spacer 350. The spacer 350 may be disposed only under the horizontal extension 314. In other words, in an embodiment, the spacer 350 is not disposed between the gate 332 and the substrate 301. The gate contact 385 may be disposed on the top surface of the gate 332. A device isolation layer 375 may be disposed on portions of the substrate 301 on both sides of the gate 332 of the other transistor 330. The device isolation layer 375 may include an STI layer or a p-type barrier layer. According to embodiments, source/drain regions may be arranged on both sides of the gate 332 in a direction entering the plane in the figure.

The image sensor 300 according to an embodiment may have a single pixel structure or a shared pixel structure. For example, in terms of the pixel structure, the image sensor 300 according to an embodiment may have the single pixel structure of FIG. 2A or the shared pixel structure of FIG. 6A, except that a gate has a single vertical gate structure.

FIGS. 8A to 8H are cross-sectional views schematically showing operations of a method of manufacturing the image sensor of FIG. 2B according to an embodiment. For convenience of explanation, a further description of components and technical aspects previously given with reference to FIGS. 1 to 7 may be only briefly given or omitted.

Figure 8A:
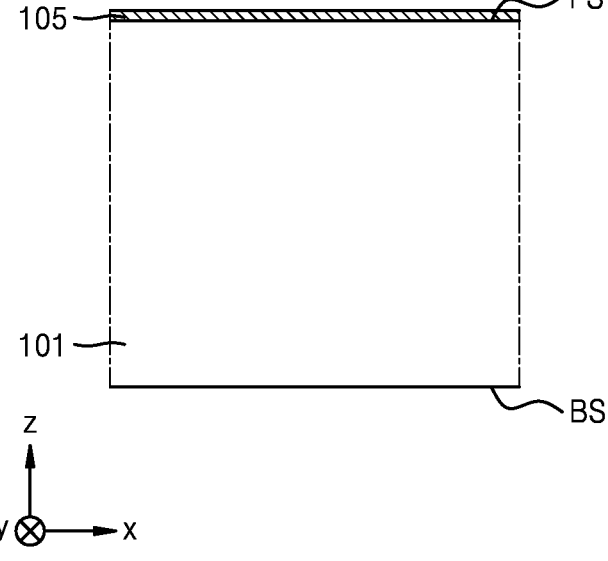
FIGS. 8A to 8H are cross-sectional views schematically showing operations of a method of manufacturing the image sensor of FIG. 2B according to an embodiment.

Referring to FIG. 8A, in a method of manufacturing an image sensor including a dual vertical gate according to an embodiment (hereinafter, simply referred to as a "method of manufacturing an image sensor"), first, the substrate insulation layer 105 is formed on the front surface FS of the substrate 101. The substrate insulation layer 105 may be formed through a thermal oxidation process or an ALD process. Here, the front surface FS of the substrate 101 may refer to a surface on which an active region and wires over the active region are formed. The substrate insulation layer 105 may include, for example, a thermal oxide layer, a silicon oxide layer, an aluminum oxide layer, etc., and may have a thickness of about 10 nm or less. However, the material and the thickness of the substrate insulation layer 105 are not limited to those stated above.

Figure 8B:
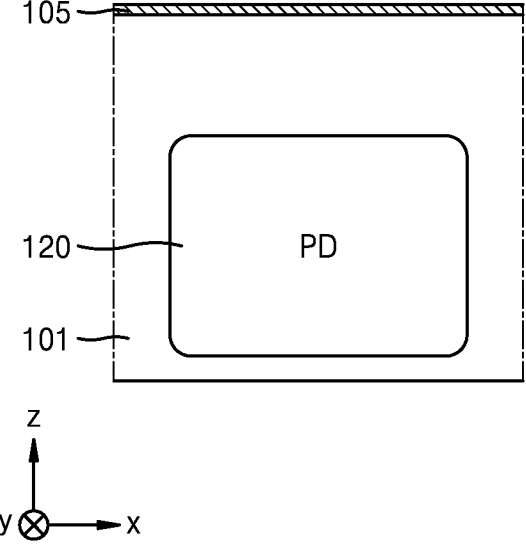

Referring to FIG. 8B, the photodiode 120 is formed in the substrate 101. The photodiode 120 may be formed by doping impurities into the substrate 101 to a certain depth. For example, a first impurity region may be formed by implanting a first conductivity type (e.g., p-type) impurity into the substrate 101 and a second impurity region may be formed by implanting a second conductivity type (e.g., n-type) impurity into the substrate 101, thereby forming the photodiode 120. The first impurity region and the second impurity region of the photodiode 120 may form a p-n junction. According to some embodiments, the substrate 101 may serve as the first impurity region. In such a case, the photodiode 120 may be formed by forming the second impurity region by implanting a second conductivity type impurity into the substrate 101 without separately forming the first impurity region.

Figure 8C:
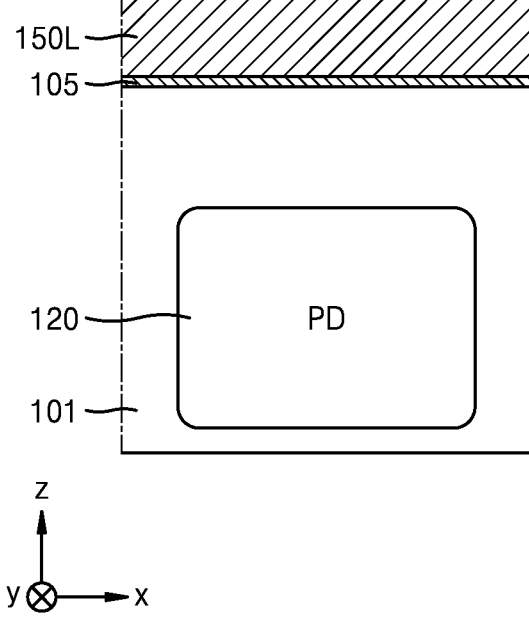

Referring to FIG. 8C, a spacer layer 150L is formed on the substrate insulation layer 105. The spacer layer 150L may include, for example, a nitride layer, an oxide layer, or an oxynitride layer. For example, the spacer layer 150L may include a silicon nitride layer. The spacer layer 150L may have a thickness of about 10 nm or more in the z direction. For example, the spacer layer 150L may have a thickness from about 50 nm to about 300 nm. However, the thickness of the spacer layer 150L is not limited to the above values. For example, the thickness of the spacer layer 150L may be determined considering the length of the vertical extensions 112 of the dual vertical gate 110 to be formed later and the effect of removing the potential hump.

Figure 8D:
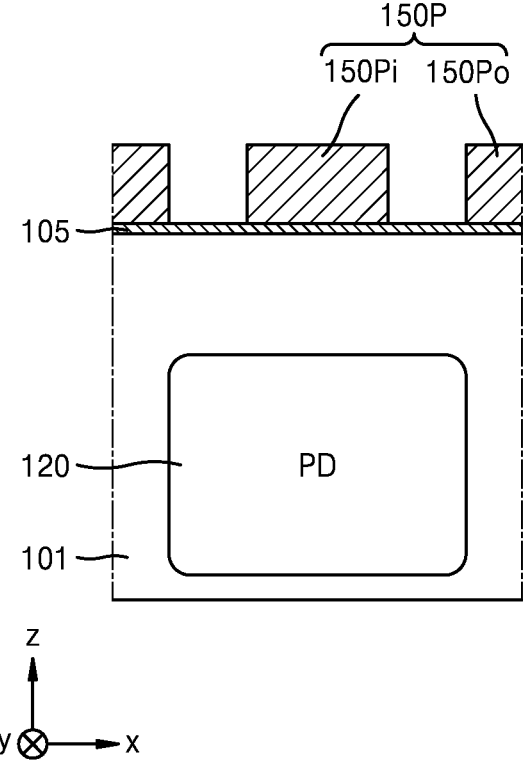

Referring to FIG. 8D, a spacer pattern 150P is formed by patterning the spacer layer 150L. The spacer layer 150L may be patterned through a photolithography process. According to embodiments, a photoresist (PR) pattern may be maintained on the spacer pattern 150P. The spacer pattern 150P may include an inner pattern 150Pi corresponding to an inner spacer and an outer pattern 150Po corresponding to an outer spacer.

Figure 8E:
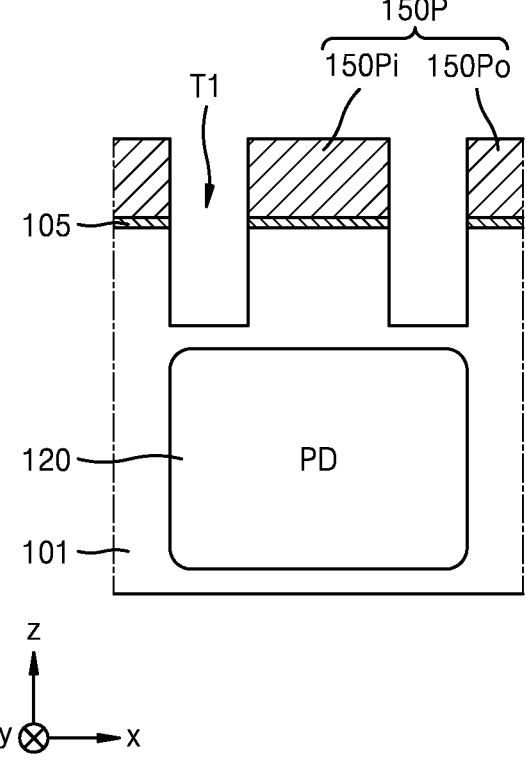

Referring to FIG. 8E, a trench T1 is formed by etching the substrate insulation layer 105 and the upper portion of the substrate 101 by using the spacer pattern 150P as an etching mask. Therefore, the spacer pattern 150P may serve as a hard mask. According to embodiments, the spacer pattern 150P and a PR pattern may also be used together as an etching mask. Two trenches T1 may be formed for one photodiode 120. The trench T1 may have a width from about 100 nm to about 200 nm in the x direction and a depth of about 300 nm or more in the z direction. However, the width and the depth of the trench T1 are not limited to the above values. For example, the depth of the trench T1 may refer to the depth from the top surface of the spacer pattern 150P.

Figure 8F:
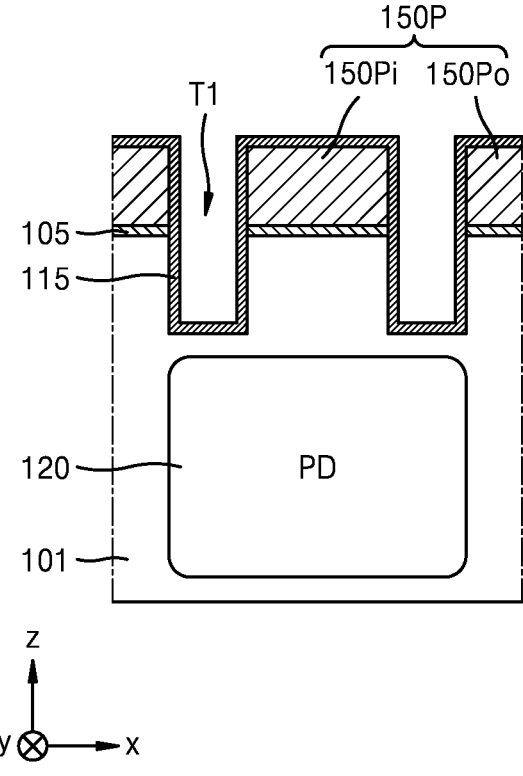

Referring to FIG. 8F, the gate insulation layer 115 covering the inside of the trench T1 and the top surface of the spacer pattern 150P is formed. The gate insulation layer 115 may have a single-layered structure or multi-layered structure. For example, the gate insulation layer 115 may include an interfacial layer and a high-k layer. The gate insulation layer 115 may be formed to a thickness of about 10 nm or less. However, the thickness of the gate insulation layer 115 is not limited to the above value.

Figure 8G:
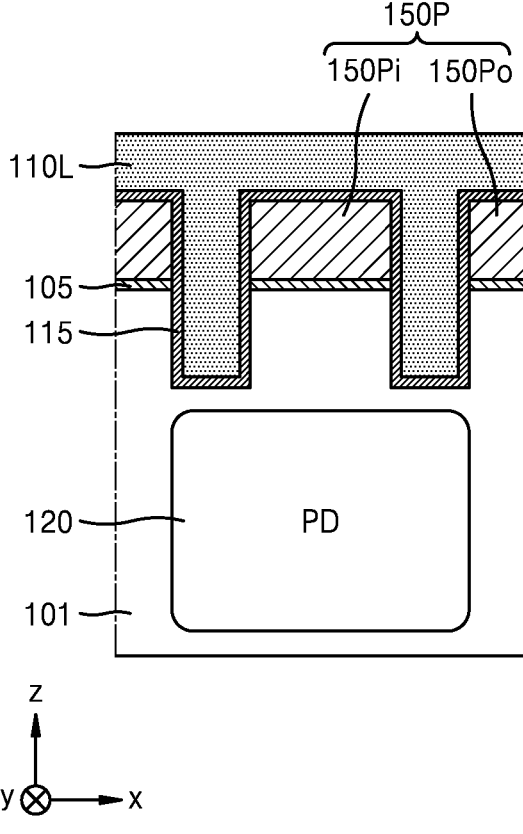

Referring to FIG. 8G, a conductive layer 110L filling the inside of the trench T1 and covering the top surface of the spacer pattern 150P is formed on the gate insulation layer 115. The conductive layer 110L may include, for example, polysilicon. However, the material constituting the conductive layer 110L is not limited to polysilicon. For example, the conductive layer 110L may be formed to have a multi-layered structure including a barrier layer and at least one metal layer.

Figure 8H:
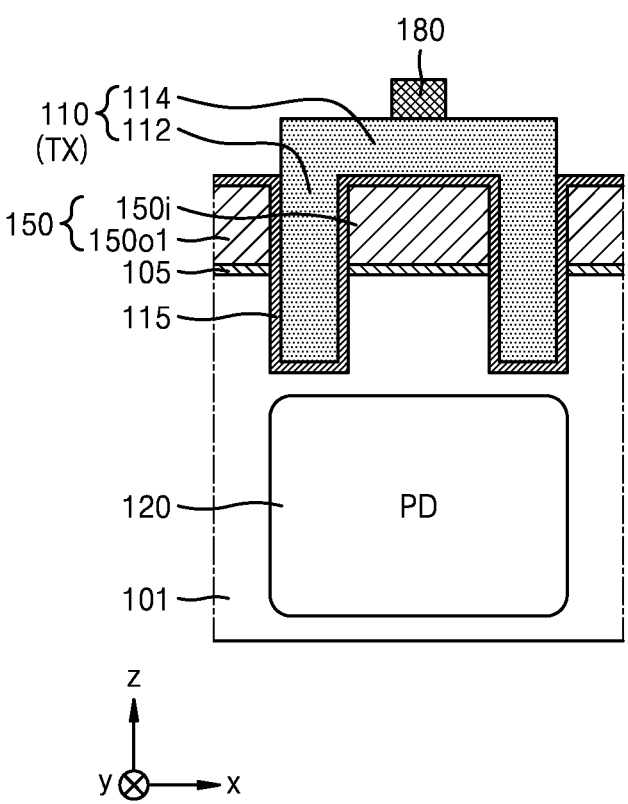

Referring to FIG. 8H, the dual vertical gate 110 is formed by patterning the conductive layer 110L. The conductive layer 110L may be patterned through a photolithography process. The dual vertical gate 110 may include two vertical extensions 112 and the connection portion 114. Thereafter, the gate contact 180 may be formed at the central portion of the connection portion 114 of the dual vertical gate 110. For example, the gate contact 180 may be formed by forming an interlayer insulation layer covering a resulting product on the substrate 101, forming a through hole in the interlayer insulation layer, and then filling the through hole with a metal material such as, for example, W, Al, or Cu.

Furthermore, before forming the gate contact 180, a portion of the outer pattern 150Po outside the spacer pattern 150P of the dual vertical gate 110 may be removed through a photolithography process. The spacer 150 may be formed by removing a portion of the outer pattern 150Po. The portion of the outer pattern 150Po may be removed, such that the gate (132 of FIG. 3B) of another transistor (130 of FIG. 3B) in the pixel is disposed on the substrate 101 without intervening with a spacer therebetween.

Figure 9A:
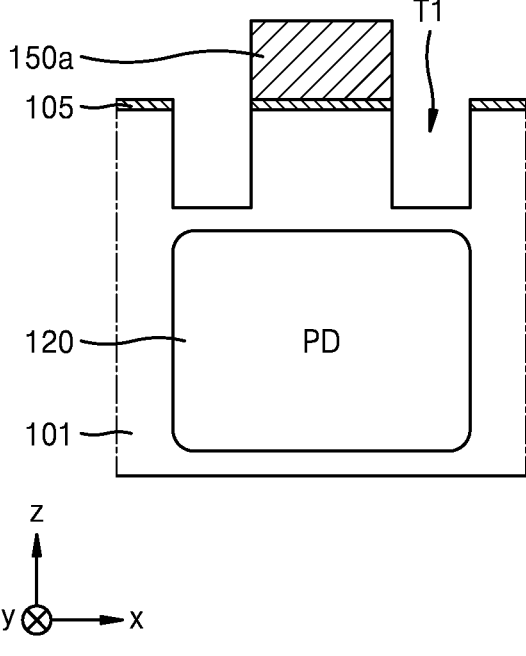
FIGS. 9A to 9C are cross-sectional views schematically showing operations of a method of manufacturing the image sensor of FIG. 3A according to an embodiment.
Figure 9B:
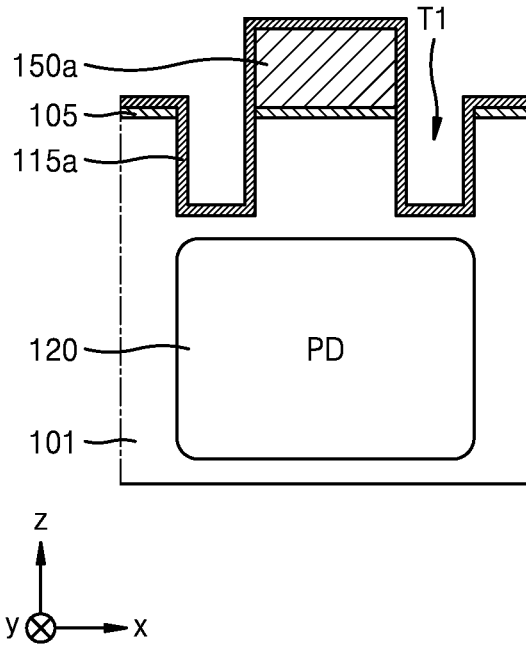
Figure 9C:
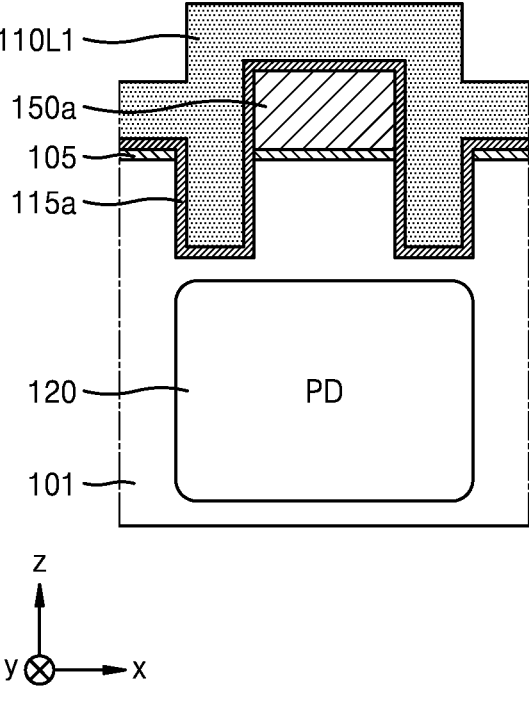

FIGS. 9A to 9C are cross-sectional views schematically showing operations of a method of manufacturing the image sensor of FIG. 3A according to an embodiment. For convenience of explanation, a further description of components and technical aspects previously described with reference to FIG. 3A and FIGS. 8A to 8H may be only briefly given or omitted.

Referring to FIG. 9A, in the method of manufacturing an image sensor according to an embodiment, the trench T1 is formed in the upper portion of the substrate 101 through the operations of FIGS. 8A to 8E. Thereafter, the spacer 150a is formed by removing the outer pattern 150Po of the spacer pattern 150P and leaving only the inner pattern 150Pi. According to embodiments, a portion of the outer pattern 150Po may be maintained around the trench T1.

Referring to FIG. 9B, after the spacer 150a is formed, the gate insulation layer 115a covering the inside of the trench T1, the top surface of the spacer 150a, and the top surface of the substrate insulation layer 105 is formed. The gate insulation layer 115a may have a single-layered structure or multi-layered structure. For example, the gate insulation layer 115a may include an interfacial layer and a high-k layer. The gate insulation layer 115a may be formed to a thickness of about 10 nm or less. However, the thickness of the gate insulation layer 115a is not limited to the above value.

Referring to FIG. 9C, a conductive layer 110L1 filling the inside of the trench T1 and covering the top surface of the spacer 150a is formed on the gate insulation layer 115a. The conductive layer 110L1 may directly cover the gate insulation layer 115a at a portion outside the trench T1 where the spacer 150a is not present. The conductive layer 110L1 may include, for example, polysilicon. However, the material constituting the conductive layer 110L1 is not limited to polysilicon. For example, the conductive layer 110L1 may be formed to have a multi-layered structure including a barrier layer and at least one metal layer.

Thereafter, the dual vertical gate 110 is formed by patterning the conductive layer 110L1. The conductive layer 110L1 may be patterned through a photolithography process. The dual vertical gate 110 may include two vertical extensions 112 and the connection portion 114.

In the method of manufacturing an image sensor according to an embodiment, the outer pattern 150Po of the spacer pattern 150P is removed in advance to form the spacer 150a before the formation of the conductive layer 110L1, and thus, a separate patterning operation for forming another transistor 130T in a pixel after the dual vertical gate 110 is formed is not performed. Also, the gate 132 of the other transistor 130T in the pixel may be formed together when the dual vertical gate 110 is formed.

Figure 10A:
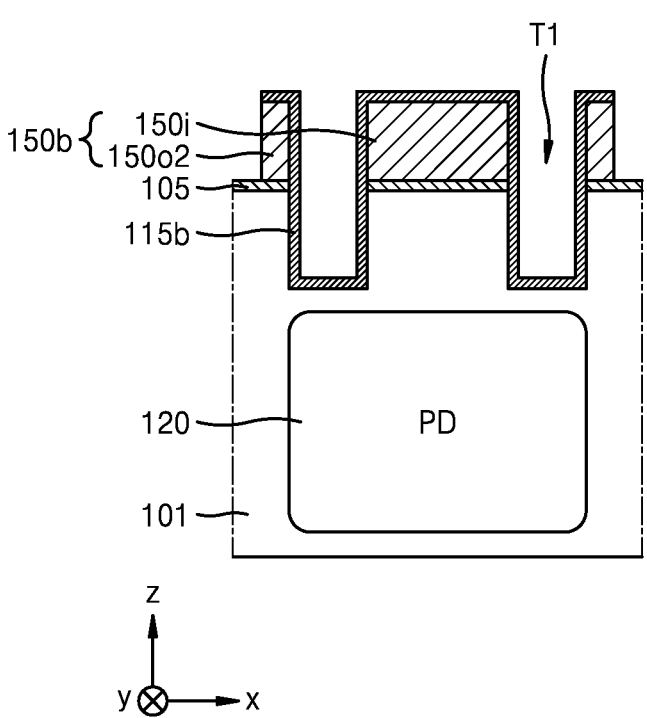
FIGS. 10A and 10B are cross-sectional views schematically showing operations of a method of manufacturing the image sensor of FIG. 4A according to an embodiment.
Figure 10B:
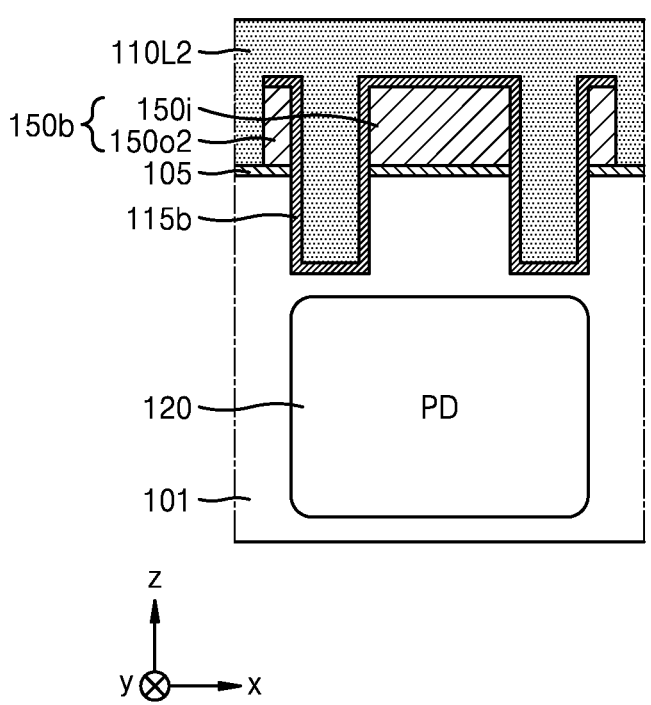

FIGS. 10A and 10B are cross-sectional views schematically showing operations of a method of manufacturing the image sensor of FIG. 4A according to an embodiment. For convenience of explanation, a further description of components and technical aspects previously described with reference to FIG. 4A and FIGS. 8A to 8H may be only briefly given or omitted.

Referring to FIG. 10A, in the method of manufacturing an image sensor according to an embodiment, a gate insulation layer 115b covering the inside of the trench T1 and the top surface of the spacer pattern 150P is formed through the operations of FIGS. 8A to 8F. The gate insulation layer 115b may have a single-layered structure or multi-layered structure. For example, the gate insulation layer 115b may include an interfacial layer and a high-k layer. The gate insulation layer 115b may be formed to a thickness of about 10 nm or less. However, the thickness of the gate insulation layer 115b is not limited to the above value.

Thereafter, the spacer 150b is formed by patterning the spacer pattern 150P. The spacer 150b may include the inner spacer 150i corresponding to the connection portion 114 of the dual vertical gate 110 and the outer spacer 150o2 disposed outside the dual vertical gate 110. The gate insulation layer 115b is also patterned, and thus, the substrate insulation layer 105 may be exposed in a portion where the spacer pattern 150P is not present.

Referring to FIG. 10B, a conductive layer 110L2 filling the inside of the trench T1 and covering the top surface of the spacer 150a is formed on the gate insulation layer 115b. The conductive layer 110L2 may directly cover the substrate insulation layer 105 at a portion outside the trench T1 where the spacer 150b is not present. The conductive layer 110L2 may include, for example, polysilicon. However, the material constituting the conductive layer 110L2 is not limited to polysilicon. For example, the conductive layer 110L2 may be formed to have a multi-layered structure including a barrier layer and at least one metal layer.

Thereafter, the dual vertical gate 110 is formed by patterning the conductive layer 110L2. The conductive layer 110L2 may be patterned through a photolithography process. The dual vertical gate 110 may include two vertical extensions 112 and the connection portion 114.

In the method of manufacturing an image sensor according to an embodiment, the spacer pattern 150P is patterned in advance to form the spacer 150b before the formation of the conductive layer 110L2, and thus, a separate patterning operation for forming another transistor 130T in a pixel after the dual vertical gate 110 is formed is not performed. Also, the gate 132 of the other transistor 130T in the pixel may be formed together when the dual vertical gate 110 is formed.

Figure 11:
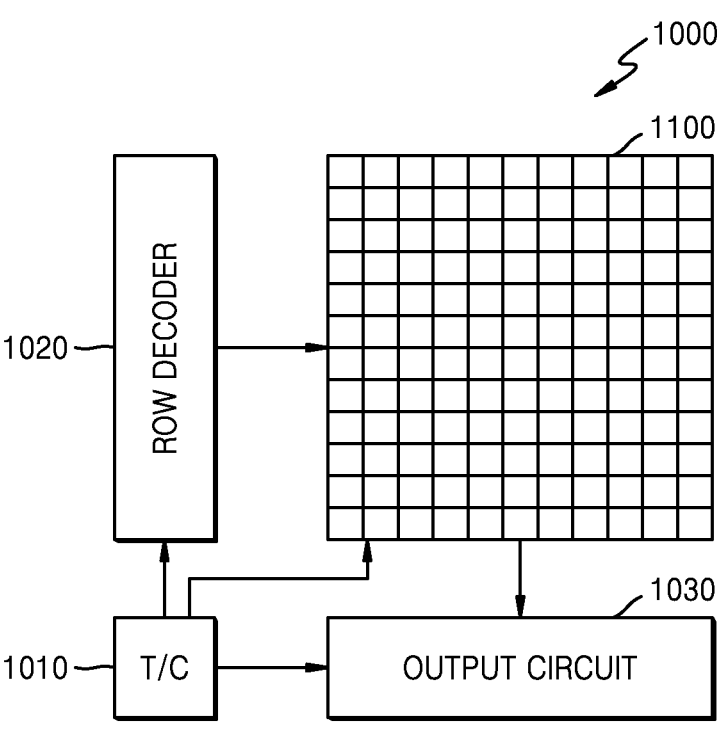
FIG. 11 is a block diagram showing the overall structure of an image sensor according to an embodiment.

FIG. 11 is a block diagram showing the overall structure of an image sensor according to an embodiment. For convenience of explanation a further description of components and technical aspects previously described with reference to FIGS. 1 to 2B or FIGS. 5 to 6C, and descriptions identical to those already described with reference to FIGS. 1 to 10B, may be only briefly given or omitted.

Referring to FIG. 11, an image sensor 1000 according to an embodiment may include a pixel array 1100, a timing controller 1010, a row decoder 1020, and an output circuit 1030. The image sensor 1000 according to an embodiment may be, for example, a charge-coupled device (CCD) image sensor or a complementary metal oxide semiconductor (CMOS) image sensor.

The image sensor 1000 according to an embodiment may be any one of image sensors 100, 100a, 100b, 200, and 300 of FIGS. 2B, 3A, 4A, 6C, and 7. Therefore, the pixel array 1100 may include the plurality of pixels PXs and/or shared pixels SPXs arranged in a 2-dimensional array structure along a plurality of rows and a plurality of columns. The row decoder 1020 may select any one row from among the plurality of rows of the pixel array 1100 in response to a row address signal output from the timing controller 1010. The output circuit 1030 may output image signals column-by-column from the plurality of pixels PX and/or the plurality of shared pixels SPXs arranged along a selected row. The output circuit 1030 may include an analog/digital (A/D) converter ADC. For example, the output circuit 1030 may include a plurality of A/D converters ADC arranged for respective columns between a column decoder and the pixel array 1100 or one A/D converter ADC disposed at an output terminal of the column decoder. According to embodiments, the timing controller 1010, the row decoder 1020, and the output circuit 1030 may be implemented as a single chip or may be implemented as separate chips.

Figure 12:
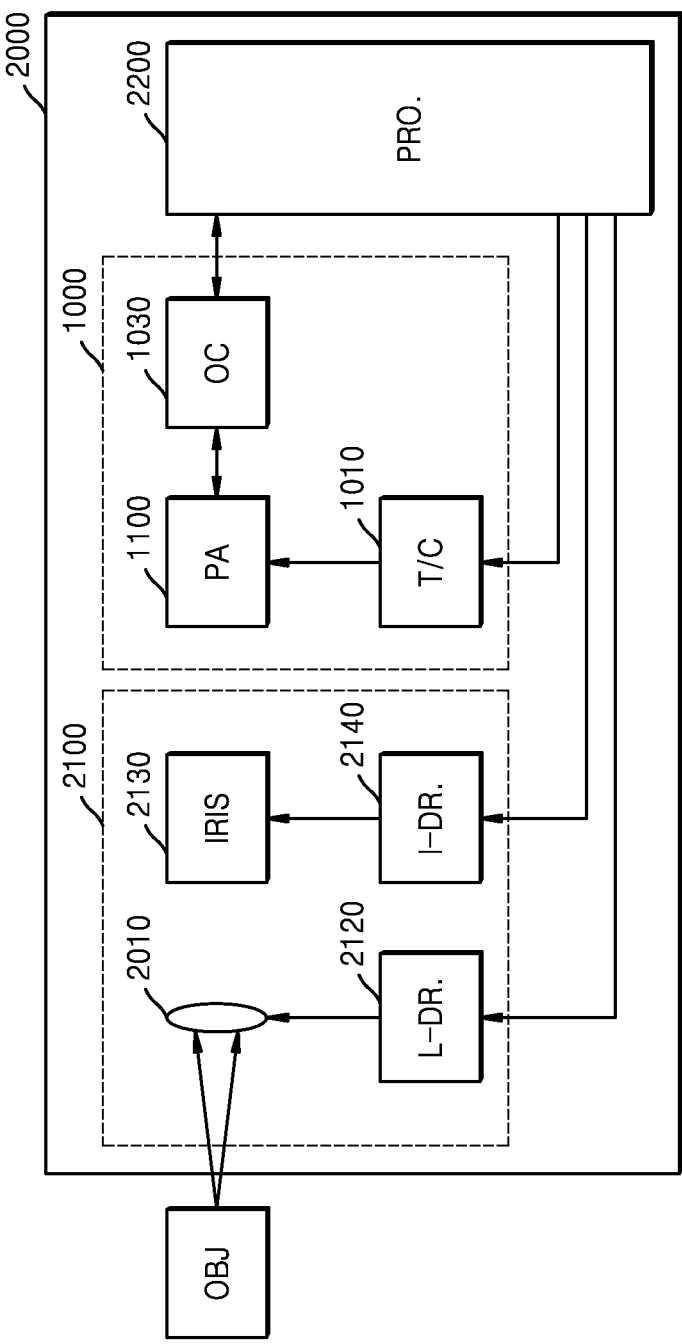
FIG. 12 is a block diagram showing the structure of an electronic device including an image sensor according to an embodiment.

FIG. 12 is a block diagram showing the structure of an electronic device including an image sensor according to an embodiment. For convenience of explanation, a further description of components and technical aspects previously described with reference to FIGS. 1 to 2B or FIGS. 5 to 6C and FIG. 11, and descriptions identical to those already described with reference to FIGS. 1 to 11, may be only briefly given or omitted.

Referring to FIG. 12, an electronic device 2000 including an image sensor according to an embodiment (hereinafter, simply referred to as an 'electronic device') may include an imaging unit 2100, the image sensor 1000, and a processor 2200. The electronic device 2000 may be, for example, a camera. The imaging unit 2100 may form an optical image by focusing light reflected from an object OBJ. The imaging unit 2100 may include an objective lens 2010, a lens driving unit 2120, an iris 2130, and an iris driving unit 2140. In FIG. 12, only one lens is representatively shown for convenience of illustration. However, the objective lens 2010 may actually include a plurality of lenses having different sizes and shapes. According to some embodiments, the electronic device 2000 may be a mobile camera, and, in the mobile camera, the iris 2130 and the iris driving unit 2140 may be omitted.

The lens driving unit 2120 may communicate information regarding focus detection with the processor 2200 and adjust the position of the objective lens 2010 according to a control signal provided from the processor 2200. The lens driving unit 2120 may move the objective lens 2010 to adjust the distance between the objective lens 2010 and the object OBJ or adjust positions of individual lenses in the objective lens 2010. As the lens driving unit 2120 drives the objective lens 2010, the focus of the object OBJ may be adjusted. Also, the lens driving unit 2120 may receive AF information and adjust positions of individual lenses in the objective lens 2010 to focus.

The iris driving unit 2140 may communicate information regarding the amount of light with the processor 2200, and adjust the iris 2130 according to a control signal provided from the processor 2200. For example, the iris driving unit 2140 may increase or decrease the aperture of the iris 2130 according to the amount of light entering the electronic device 2000 through the objective lens 2010. Also, the iris driving unit 2140 may adjust the opening time of the iris 2130.

The image sensor 1000 may generate an electrical image signal based on the intensity of light incident thereto. The image sensor 1000 may be the image sensor 1000 of FIG. 11 and may include the pixel array 1100, the timing controller 1010, and the output circuit 1030. Therefore, the image sensor 1000 may be any one of the image sensors 100, 100*a*, 100*b*, 200, and 300 of FIGS. 2B, 3A, 4A, 6C, and 7. Also, in an embodiment, the image sensor 1000 may further include the row decoder 1020.

The processor 2200 may control the overall operation of the electronic device 2000 and may have an image processing function. For example, the processor 2200 may provide control signals for operation of each of the lens driving unit 2120, the iris driving unit 2140, the timing controller 1010, etc.

While the inventive concept has been particularly shown and described with reference to embodiments thereof, it will be understood that various changes in form and detail may be made therein without departing from the spirit and scope of the inventive concept as defined by the following claims.

What is claimed is:

1. An image sensor, comprising:
a substrate;
a vertical gate comprising a vertical extension vertically extending into the substrate from a top of the substrate, and a horizontal extension extending in parallel with a top surface of the substrate from a top of the vertical extension;
a photodiode (PD) disposed under the vertical gate inside the substrate;
a spacer disposed between the horizontal extension and the substrate; and
a gate insulation layer,
wherein a bottom surface and side surfaces of the vertical extension and a bottom surface of the horizontal extension are covered by the gate insulation layer, and
the spacer is disposed between the substrate and the gate insulation layer of the horizontal extension.

2. The image sensor of claim 1, wherein the vertical gate comprises a dual vertical gate comprising two vertical extensions spaced apart from each other in a first direction parallel to the top surface of the substrate, and
the horizontal extension extends in the first direction and connects the two vertical extensions to each other.

3. The image sensor of claim 2, further comprising:
a substrate insulation layer disposed between the substrate and the spacer, and
a gate contact is disposed at a center of the horizontal extension in the first direction.

4. The image sensor of claim 2, wherein the spacer is disposed only under the horizontal extension.

5. The image sensor of claim 3, wherein at least one of the gate insulation layer and the substrate insulation layer is disposed on a portion of the substrate outside the vertical gate where the spacer is not present.

6. The image sensor of claim 5, wherein the spacer comprises an inner spacer disposed under the horizontal extension and an outer spacer disposed on the portion of the substrate outside the vertical gate.

7. The image sensor of claim 6, wherein the outer spacer extends to a length of about 300 nm or less in the first direction from the side surfaces of the vertical extension.

8. The image sensor of claim 1, wherein the image sensor has a single pixel structure in which one PD is disposed in correspondence to one floating diffusion (FD) region, or
a shared pixel structure in which a plurality of PDs including the PD are arranged in correspondence to the one FD region and the plurality of PDs share the one FD region.

9. The image sensor of claim 8, wherein the image sensor has the shared pixel structure in which four PDs surround the one FD region,
at least one transistor is disposed in a pixel corresponding to one of the four PDs, and
a gate of the transistor has a planar structure without the spacer disposed therebelow.

10. The image sensor of claim 1, wherein the spacer has a thickness of about 10 nm or more.

11. An image sensor, comprising:
a substrate;
a dual vertical gate comprising two vertical extensions vertically extending from a top of the substrate into the substrate and spaced apart from each other in a first direction parallel to a top surface of the substrate, and a connection portion connecting the two vertical extensions to each other on the substrate;
a photodiode (PD) disposed under the dual vertical gate inside the substrate;
a floating diffusion (FD) region disposed over the substrate and adjacent to the dual vertical gate in a second direction parallel to the top surface of the substrate and perpendicular to the first direction;
a transistor (TR) region disposed opposite to the FD region around the dual vertical gate and having at least one transistor disposed therein;
a gate insulation layer; and
a spacer disposed between the connection portion and the substrate,
wherein a bottom surface and side surfaces of each of the two vertical extensions and a bottom surface of the connection portion are covered by the gate insulation layer, and
the spacer is disposed between the substrate and a portion of the gate insulation layer covering the connection portion.

12. The image sensor of claim 11, wherein the spacer is disposed only under the connection portion.

13. The image sensor of claim 11, wherein the spacer comprises an inner spacer disposed under the connection portion and an outer spacer disposed on a portion of the substrate outside the dual vertical gate.

14. The image sensor of claim 11, wherein a gate of the transistor has a planar structure without the spacer disposed therebelow.

15. An image sensor, comprising:
a substrate;
a dual vertical gate comprising two vertical extensions vertically extending from a top of the substrate into the substrate and spaced apart from each other in a first direction parallel to a top surface of the substrate, and a connection portion connecting the two vertical extensions to each other on the substrate;
a photodiode (PD) disposed under the dual vertical gate inside the substrate;
one floating diffusion (FD) region disposed over the substrate and adjacent to the dual vertical gate in a second direction parallel to the top surface of the substrate and perpendicular to the first direction;

a transistor (TR) region disposed opposite to the one FD region around the dual vertical gate and having at least one transistor;

a gate insulation layer; and a spacer disposed between the connection portion and the substrate, wherein a bottom surface and side surfaces of each of the two vertical extensions and a bottom surface of the connection portion are covered by the gate insulation layer, the spacer is disposed between the substrate and a portion of the gate insulation layer covering the connection portion, and the image sensor has a shared pixel structure in which a plurality of PDs including the PD are arranged in correspondence to the one FD region and the plurality of PDs share the one FD region.

16. The image sensor of claim 15, wherein, in the shared pixel structure, an even number of PDs surrounds the one FD region, and at least one transistor is disposed on a side opposite to the one FD region around the dual vertical gate in a pixel corresponding to one of the PDs.

17. The image sensor of claim 15, wherein, in the shared pixel structure, four PDs surround the one FD region, a source-follower transistor, a reset transistor, and a selection transistor are arranged in three pixels from among four pixels respectively corresponding to the four PDs, and the source-follower transistor or a dummy transistor is disposed in the remaining one pixel.

18. The image sensor of claim 15, wherein the spacer is disposed only under the connection portion.

19. The image sensor of claim 15, wherein the spacer comprises an inner spacer disposed under the connection portion and an outer spacer disposed on a portion of the substrate outside the dual vertical gate.

20. The image sensor of claim 15, wherein a gate of the transistor has a planar structure without the spacer disposed therebelow.

* * * * *